United States Patent
Kimura et al.

(10) Patent No.: US 9,443,461 B2
(45) Date of Patent: Sep. 13, 2016

(54) ELECTRONIC DEVICE AND METHOD OF DRIVING THE SAME

(75) Inventors: Hajime Kimura, Kanagawa (JP); Yoshifumi Tanada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1272 days.

(21) Appl. No.: 12/509,228

(22) Filed: Jul. 24, 2009

(65) Prior Publication Data

US 2009/0284522 A1 Nov. 19, 2009

Related U.S. Application Data

(63) Continuation of application No. 11/039,371, filed on Jan. 20, 2005, now Pat. No. 7,567,227, which is a continuation of application No. 09/836,719, filed on Apr. 17, 2001, now Pat. No. 6,847,341.

(30) Foreign Application Priority Data

Apr. 19, 2000 (JP) .................. 2000-118619

(51) Int. Cl.
*G09G 3/30* (2006.01)
*G09G 3/20* (2006.01)
(Continued)

(52) U.S. Cl.
CPC .......... *G09G 3/2022* (2013.01); *G09G 3/3258* (2013.01); *G09G 3/2018* (2013.01);
(Continued)

(58) Field of Classification Search
CPC ................ G09G 2310/0262; G09G 23/1061; H01L 51/525
USPC .................... 345/78, 60, 76, 36–37
See application file for complete search history.

(56) References Cited

U.S. PATENT DOCUMENTS

| 4,070,663 A | 1/1978 | Kanatani et al. |
| 4,206,460 A | 6/1980 | Yasuda et al. |

(Continued)

FOREIGN PATENT DOCUMENTS

| EP | 0526232 A1 | 2/1993 |
| EP | 0 717 445 A2 | 6/1996 |

(Continued)

OTHER PUBLICATIONS

Tsutsui, T., et al, "Electroluminescence in Organic Thin Films," Photochemical Processes in Organized Molecular Systems, 1991, pp. 437-450.

(Continued)

*Primary Examiner* — William Boddie
*Assistant Examiner* — Leonid Shapiro
(74) *Attorney, Agent, or Firm* — Husch Blackwell LLP

(57) ABSTRACT

To provide a novel driving method for driving an electronic device by using digital gray scale and time gray scale in combination, which secures high duty ratio, which can display an image normally even when a sustain period is shorter than an address period, and which is hardly affected by dulled signal waveform. In a sub-frame period (102) where a sustain period is shorter than an address period, a clear period (105) is squeezed in between completion of a sustain period (104) and start of an address period of the subsequent sub-frame period. The length of the sustain period (104) thus can be set without being limited by the length of an address period (103). This non-display period is provided by changing the electric potential of a storage capacitor line. Therefore, unlike the case where the non-display period is provided by changing the electric potential of a cathode wiring, the present invention is hardly affected by dulled signal waveform.

14 Claims, 23 Drawing Sheets

(51) Int. Cl.
*G09G 3/32* (2016.01)
*H01L 51/52* (2006.01)

(52) U.S. Cl.
CPC ............. *G09G2300/0426* (2013.01); *G09G 2300/0842* (2013.01); *G09G 2300/0861* (2013.01); *G09G 2300/0876* (2013.01); *G09G 2310/0262* (2013.01); *G09G 2310/061* (2013.01); *H01L 51/525* (2013.01)

(56) References Cited

U.S. PATENT DOCUMENTS

| | | | |
|---|---|---|---|
| 4,210,848 A | 7/1980 | Suzuki et al. | |
| 4,356,429 A | 10/1982 | Tang | |
| 4,539,507 A | 9/1985 | VanSlyke et al. | |
| 4,640,581 A | 2/1987 | Nakanowatari et al. | |
| 4,720,432 A | 1/1988 | VanSlyke et al. | |
| 4,769,292 A | 9/1988 | Tang et al. | |
| 4,885,211 A | 12/1989 | Tang et al. | |
| 4,950,950 A | 8/1990 | Perry et al. | |
| 5,047,687 A | 9/1991 | VanSlyke | |
| 5,059,861 A | 10/1991 | Littman et al. | |
| 5,073,446 A | 12/1991 | Scozzafava et al. | |
| 5,151,629 A | 9/1992 | VanSlyke | |
| 5,235,253 A * | 8/1993 | Sato .............. G09G 3/30 315/169.3 | |
| 5,247,190 A | 9/1993 | Friend et al. | |
| 5,294,869 A | 3/1994 | Tang et al. | |
| 5,294,870 A | 3/1994 | Tang et al. | |
| 5,399,502 A | 3/1995 | Friend et al. | |
| 5,550,066 A * | 8/1996 | Tang et al. ............. 438/29 | |
| 5,610,742 A | 3/1997 | Hinata et al. | |
| 5,684,499 A | 11/1997 | Shimizu et al. | |
| 5,687,465 A | 11/1997 | Hinata et al. | |
| 5,742,129 A | 4/1998 | Nagayama et al. | |
| 5,839,456 A | 11/1998 | Han | |
| 5,874,932 A | 2/1999 | Nagaoka et al. | |
| 5,952,789 A | 9/1999 | Stewart et al. | |
| 5,962,962 A | 10/1999 | Fujita et al. | |
| 5,990,629 A | 11/1999 | Yamada et al. | |
| 6,084,579 A | 7/2000 | Hirano | |
| 6,121,994 A * | 9/2000 | Kuribayashi et al. ........ 347/237 | |
| 6,147,451 A | 11/2000 | Shibata et al. | |
| 6,175,345 B1 | 1/2001 | Kuribayashi et al. | |
| 6,246,180 B1 | 6/2001 | Nishigaki | |
| 6,353,423 B1 | 3/2002 | Kang et al. | |
| 6,373,455 B1 | 4/2002 | Kuribayashi et al. | |
| 6,407,506 B1 | 6/2002 | Naka et al. | |
| 6,462,433 B1 | 10/2002 | Nitta et al. | |
| 6,462,722 B1 | 10/2002 | Kimura et al. | |
| 6,496,240 B1 | 12/2002 | Zhang et al. | |
| 6,522,315 B2 | 2/2003 | Ozawa et al. | |
| 6,541,918 B1 | 4/2003 | Yudasaka | |
| 6,548,960 B2 | 4/2003 | Inukai | |
| 6,611,108 B2 | 8/2003 | Kimura | |
| 6,618,029 B1 | 9/2003 | Ozawa | |
| 6,680,764 B2 | 1/2004 | Zhang et al. | |
| 6,730,966 B2 | 5/2004 | Koyama | |
| 6,781,155 B1 | 8/2004 | Yamada | |
| 6,791,129 B2 | 9/2004 | Inukai | |
| 6,839,045 B2 | 1/2005 | Ozawa et al. | |
| 6,847,341 B2 | 1/2005 | Kimura et al. | |
| 6,937,306 B2 | 8/2005 | Zhang et al. | |
| 7,030,847 B2 | 4/2006 | Kimura | |
| 7,053,890 B2 | 5/2006 | Inukai | |
| 7,061,451 B2 | 6/2006 | Kimura | |
| 7,091,936 B1 | 8/2006 | Yamada | |
| 7,113,154 B1 | 9/2006 | Inukai | |
| 7,158,199 B2 | 1/2007 | Zhang et al. | |
| 7,180,483 B2 | 2/2007 | Kimura et al. | |
| 7,221,339 B2 | 5/2007 | Ozawa et al. | |
| 7,253,793 B2 | 8/2007 | Ozawa et al. | |
| 7,397,451 B2 | 7/2008 | Ozawa | |
| 7,460,094 B2 | 12/2008 | Ozawa | |
| 7,528,912 B2 | 5/2009 | Zhang et al. | |
| 7,567,227 B2 | 7/2009 | Kimura et al. | |
| 7,710,364 B2 | 5/2010 | Ozawa et al. | |
| 7,817,232 B2 | 10/2010 | Zhang et al. | |
| 7,880,696 B2 | 2/2011 | Ozawa et al. | |
| 8,031,307 B2 | 10/2011 | Zhang et al. | |
| 8,154,199 B2 | 4/2012 | Ozawa et al. | |
| 8,188,647 B2 | 5/2012 | Kimura et al. | |
| 8,247,967 B2 | 8/2012 | Ozawa et al. | |
| 8,354,978 B2 | 1/2013 | Ozawa et al. | |
| 8,362,489 B2 | 1/2013 | Kimura et al. | |
| 2001/0002703 A1 | 6/2001 | Koyama | |
| 2001/0035863 A1 | 11/2001 | Kimura | |
| 2002/0000576 A1 | 1/2002 | Inukai | |
| 2002/0047120 A1 | 4/2002 | Inukai | |
| 2002/0047555 A1 | 4/2002 | Inukai | |
| 2002/0053884 A1 | 5/2002 | Kimura | |
| 2002/0113760 A1 | 8/2002 | Kimura | |
| 2003/0151568 A1 | 8/2003 | Ozawa | |
| 2003/0231273 A1 | 12/2003 | Kimura et al. | |
| 2008/0158209 A1 | 7/2008 | Ozawa | |
| 2008/0165174 A1 | 7/2008 | Ozawa | |
| 2008/0198152 A1 | 8/2008 | Ozawa | |
| 2008/0246700 A1 | 10/2008 | Ozawa et al. | |
| 2012/0299902 A1 | 11/2012 | Ozawa et al. | |

FOREIGN PATENT DOCUMENTS

| | | |
|---|---|---|
| EP | 0 781 075 A1 | 6/1997 |
| EP | 0 883 191 A2 | 12/1998 |
| EP | 0 895 219 A1 * | 2/1999 |
| EP | 0 935 229 A1 | 8/1999 |
| EP | 0 989 534 A1 | 3/2000 |
| EP | 1 061 497 A1 | 12/2000 |
| EP | 1 505 650 A2 | 2/2005 |
| EP | 1 505 651 A2 | 2/2005 |
| EP | 1 505 652 A2 | 2/2005 |
| EP | 2 112 693 A2 | 10/2009 |
| EP | 2 151 865 A1 | 2/2010 |
| JP | 60-111068 U | 7/1985 |
| JP | 61-029821 A | 2/1986 |
| JP | 61-052629 A | 3/1986 |
| JP | 63-108696 A | 5/1988 |
| JP | 02-293713 A | 12/1990 |
| JP | 03-034289 A | 2/1991 |
| JP | 06-075209 A | 3/1994 |
| JP | 8-78159 | 3/1996 |
| JP | 8-227276 | 9/1996 |
| JP | 8-241048 | 9/1996 |
| JP | 9-114411 | 5/1997 |
| JP | 10-92576 | 4/1998 |
| JP | 10-134962 A | 5/1998 |
| JP | 10-172757 A | 6/1998 |
| JP | 10-189525 | 7/1998 |
| JP | 10-214042 A | 8/1998 |
| JP | 10-319872 | 12/1998 |
| JP | 10-319908 | 12/1998 |
| JP | 10-333641 | 12/1998 |
| JP | 11-3048 | 1/1999 |
| JP | 11-8075 | 1/1999 |
| JP | 11-24606 | 1/1999 |
| JP | 11-024606 A | 1/1999 |
| JP | 11-054268 A | 2/1999 |
| JP | 11-084424 A | 3/1999 |
| JP | 11-101985 A | 4/1999 |
| JP | 11-111450 A | 4/1999 |
| JP | 11-329717 A | 11/1999 |
| JP | 11-337968 A | 12/1999 |
| JP | 2000-040585 A | 2/2000 |
| JP | 2000-221942 | 8/2000 |
| JP | 2000-235370 | 8/2000 |
| JP | 2000-347621 | 12/2000 |
| JP | 2001-42822 | 2/2001 |
| JP | 2001-60076 | 3/2001 |
| JP | 2001-109399 | 4/2001 |
| JP | 2002-6808 | 1/2002 |
| WO | WO 90/13148 A1 | 11/1990 |

(56) References Cited

FOREIGN PATENT DOCUMENTS

| WO | WO 98/33165 | 7/1998 |
| WO | WO 98/36407 A1 | 8/1998 |
| WO | WO 99/46748 A1 | 9/1999 |

OTHER PUBLICATIONS

Baldo, M.A., et al, "Highly Efficient Phosphorescent Emission from Organic Electroluminescent Devices," Nature, vol. 395, Sep. 10, 1998, pp. 151-154.

Baldo, M.A., et al, "Very High-Efficiency Green Organic Light-Emitting Devices Based on Electrophosphorescence," Applied Physics Letters, Jul. 5, 1999, vol. 75, No. 1, pp. 4-6.

Tsutsui, T., et al, "High Quantum Efficiency in Organic Light-Emitting Devices with Iridium-Complex as a Triplet Emissive Center," Japanese Journal of Applied Physics, Dec. 15, 1999, vol. 38, part 2, No. 12B, pp. L 1502-L 1504.

Shimoda, T., et al, "26.2: Invited Paper: Current Status and Future of Light-Emitting Polymer Display Driven by Poly-Si TFT," SID '99 Digest, 1999, pp. 372-375.

Shimoda, T., et al, "High Resolution Light Emitting Polymer Display Driven by Low Temperature Polysilicon Thin Film Transistor with Integrated Driver," Asia Display '98, 1998, pp. 217-220.

Han, C.W., et al, "3.8, Green OLED with Low Temperature Poly Si TFT," EURODISPLAY '99, Proceedings of the 19th International Display Research Conference, Berlin, Germany, Sep. 6-9, 1999, pp. 27-30.

Kimura, M., et al, "TFT-LEPD with Image Uniformity by Area Ratio Gray Scale," EURODISPLAY '99, Proceedings of the 19th International Display Research Conference, Berlin, Germany, Sep. 6-9, 1999, pp. 71-74.

Shimoda, T., et al, "Technology for Active Matrix Light Emitting Polymer Displays," IEDM 99, 1999, pp. 107-110.

Kimura, M., et al, "Low-Temperature Poly-Si TFT Driven Light-Emitting—Polymer Displays and Digital Gray Scale for Uniformity," IDW '99, 1999, pp. 171-174.

Schenk, H., et al, "Polymers for Light Emitting Diodes," EURODISPLAY '99, Proceedings of the 19th International Display Research Conference, Berlin, Germany, Sep. 6-9, 1999, pp. 33-37.

* cited by examiner

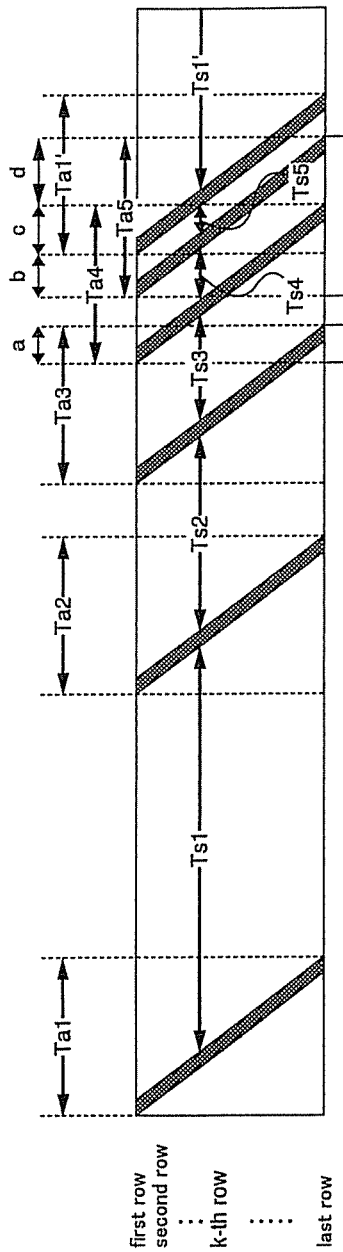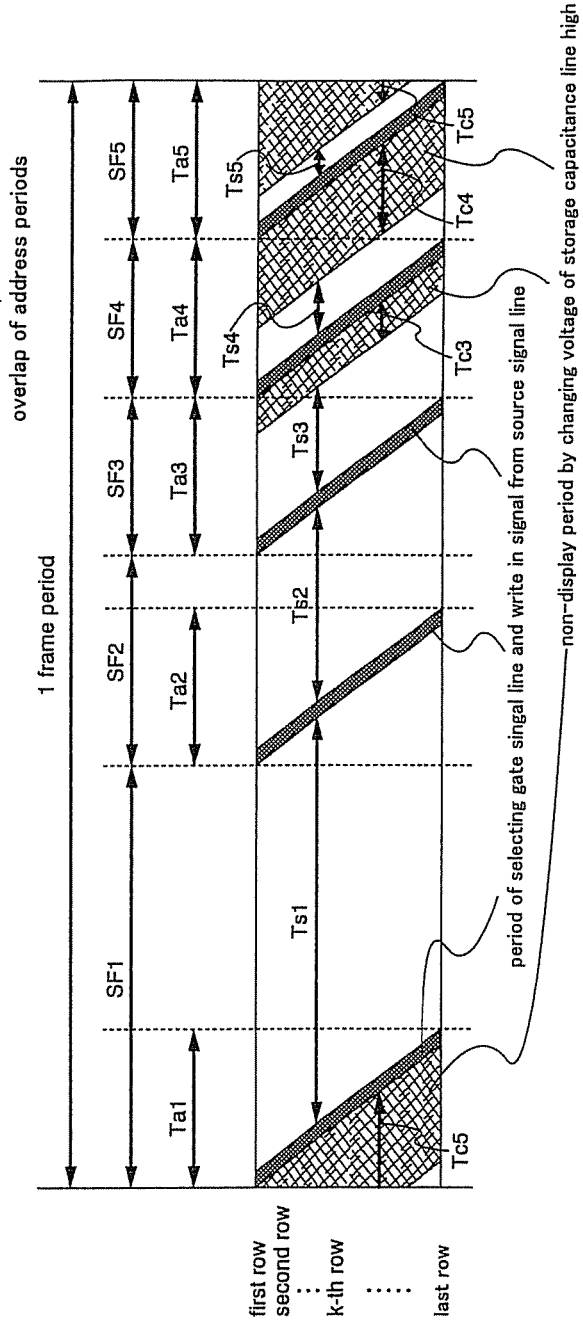

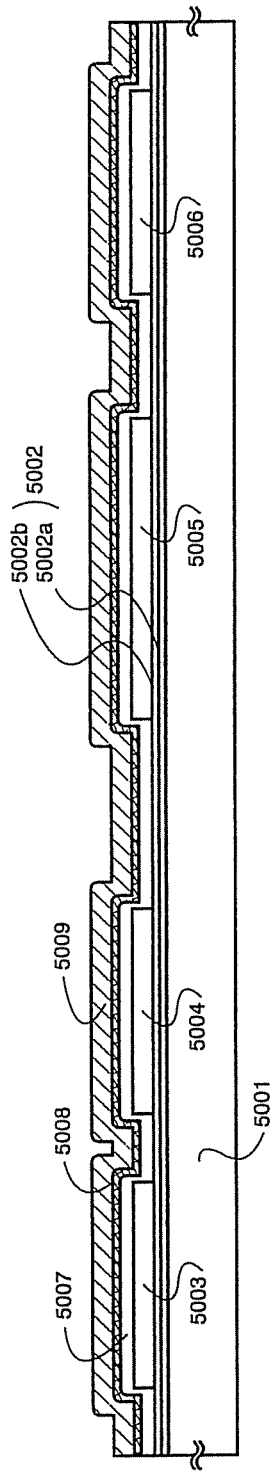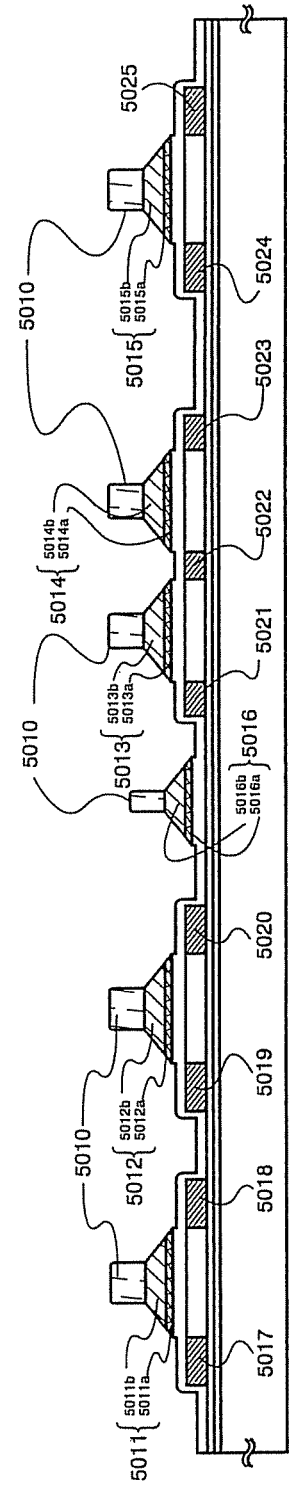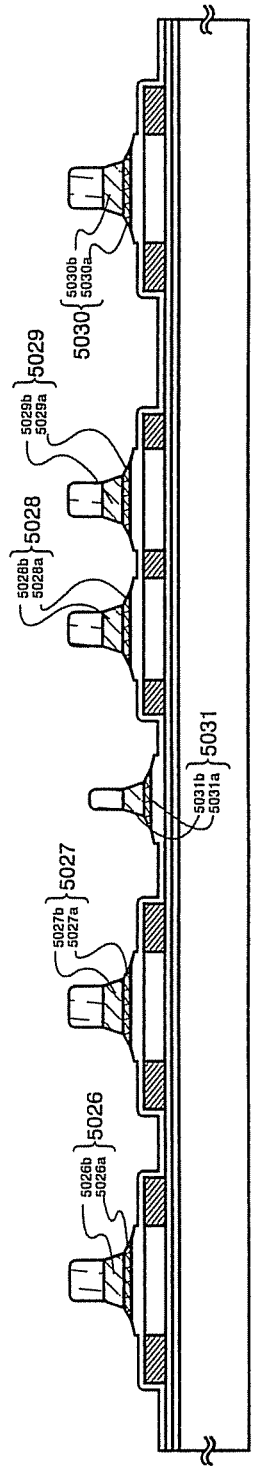
Fig. 4A
Fig. 4B
Fig. 4C

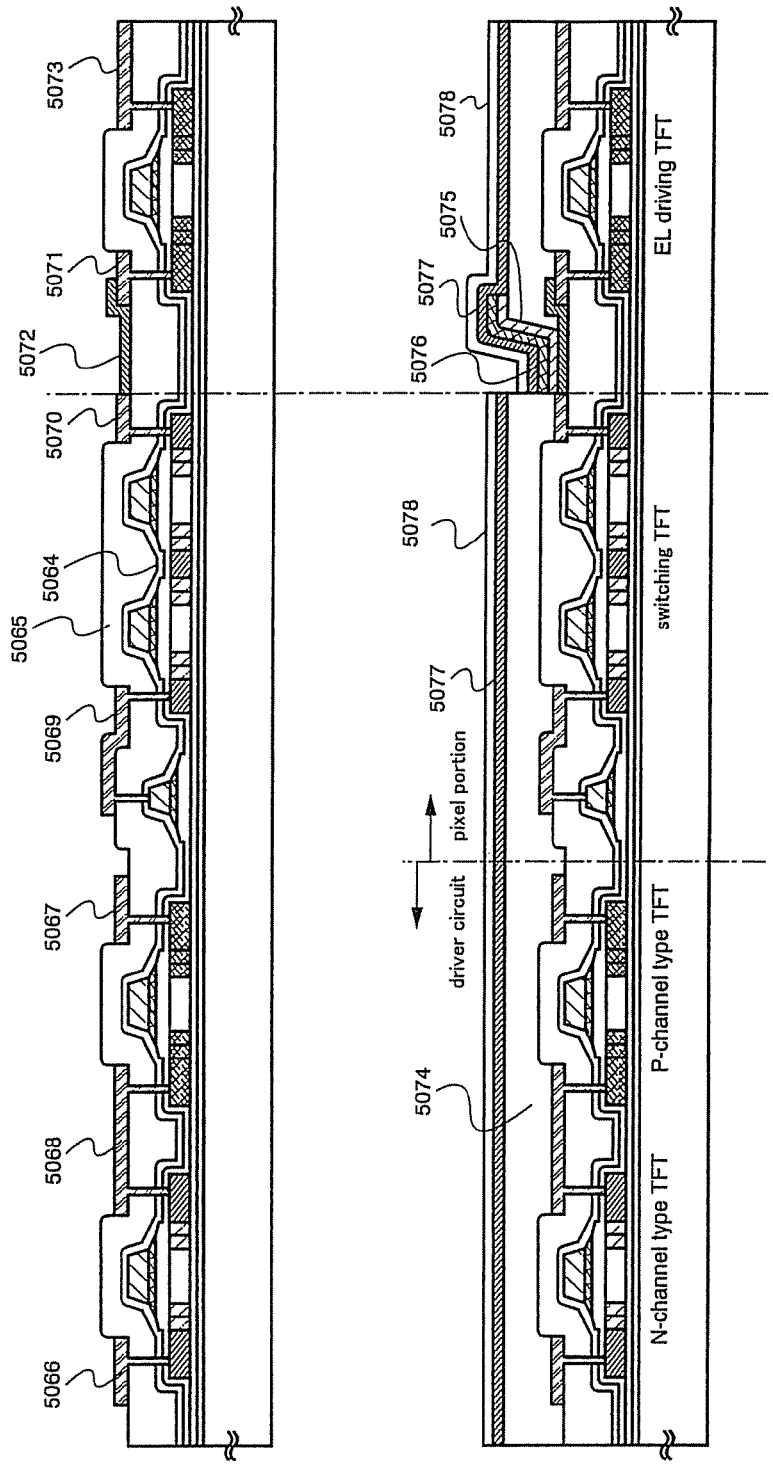

4701  4702  4703       4704  4705

4706 4707  4708 4709      4710  4711

1801  1802   1803 1804 voltage of two terminals of storage capacitor 1801   1804  1803   1802

1901  1902  1903  1904 source-drain electric potential of switching TFT 1901  1903  1904  1902

ELECTRONIC DEVICE AND METHOD OF DRIVING THE SAME

This application is a continuation of U.S. application Ser. No. 11/039,371 filed on Jan. 20, 2005 now U.S. Pat. No. 7,567,227 which is a continuation of U.S. application Ser. No. 09/836,719 filed on Apr. 17, 2001 (now U.S. Pat. No. 6,847,341 issued Jan. 25, 2005).

BACKGROUND OF THE INVENTION

1. Field of the Invention

The present invention relates to the structure of an electronic device. The invention particularly relates to a method of driving an active matrix electronic device having a thin film transistor (TFT) that is formed on an insulator and to an electronic device driven by the method.

2. Description of the Related Art

EL displays have lately been attracting attention as a flat panel display to replace LCDs (liquid crystal displays), and researches are being actively made on the EL displays.

Similar to LCDs that have roughly two types of driving methods with one being passive matrix type used in, e.g., STN-LCDs and the other being active matrix type used in, e.g., TFT-LCDs, EL displays also are driven by roughly two types of driving methods. One is passive matrix type and the other is active matrix type.

In the case of the passive matrix type method, wirings to serve as electrodes are arranged above and below an EL element. A voltage is sequentially applied to the wirings to cause a current to flow in the EL element, whereby the EL element emits light. In the active matrix type method, on the other hand, each pixel has a TFT so that signals can be held in each pixel.

FIGS. 14A and 14B show an example of the structure of an active matrix electronic device used in EL displays. FIG. 14A is a diagram showing the entire circuit structure in which a pixel portion 1453 is arranged in the center of a substrate 1450. To the right and left of the pixel portion, gate signal line side driver circuits 1452 are arranged to control gate signal lines. It is not necessary to place the gate signal line side driver circuits 1452 on both sides of the pixel portion but instead one gate signal line side driver circuit may be provided on one side thereof. However, considering circuit operation efficiency and reliability, it is desirable to arrange the driver circuits on both sides. A source signal line side driver circuit 1451 for controlling source signal lines is arranged above the pixel portion 1453. One of pixels in FIG. 14A is enlarged and shown in FIG. 14B. Denoted by 1401 in FIG. 14B is a TFT functioning as a switching element when a signal is written in a pixel (hereinafter referred to as switching TFT). Reference symbol 1402 denotes a TFT functioning as an element for controlling a current to be supplied to an EL element 1403 (current controlling element) (the TFT will be referred to as EL driving TFT). According to a general and frequently employed method, a p-channel TFT is chosen as the EL driving TFT because source grounding is satisfactory in light of TFT behavior and there are restrictions in manufacture of the EL driving element 1403, and the EL driving TFT 1402 is arranged between an anode of the EL element 1403 and a current supply line 1407. Reference symbol 1404 denotes a storage capacitor for holding a signal (voltage) inputted from a source signal line 1406. The storage capacitor 1404 in FIG. 14B has one terminal connected to the current supply line 1407. However, wiring exclusive to the storage capacitor may be used instead. The switching TFT 1401 has a gate terminal connected to a gate signal line 1405, and has a source terminal connected to the source signal line 1406. The EL driving TFT 1402 has a drain terminal connected to an anode or a cathode of the EL element 1403, and has a source terminal connected to the current supply line 1407.

The EL element is comprised of an anode, a cathode, and a layer containing an organic compound that provides electro luminescence (luminescence generated by applying electric field) (the layer hereinafter referred to as EL layer). The luminescence from an organic compound can be divided into light emission upon returning from singlet excitation to the ground state (fluorescence) and light emission upon returning from triplet excitation to the ground state (phosphorescence). Both kinds of light emission can be used in light emitting devices to which the present invention is applicable.

The EL layer defined herein includes all the layers that are provided between an anode and a cathode. Specifically, the EL layer is comprised of a light emitting layer, a hole injection layer, an electron injection layer, a hole transportation layer, an electron transportation layer, and some other layers. The basic structure of an EL element is a laminate in which an anode, a light emitting layer and a cathode are sequentially layered. Other types of EL layer structure are a laminate in which an anode, a hole injection layer, a light emitting layer and a cathode are sequentially layered, and a laminate in which an anode, a hole injection layer, a light emitting layer, an electron transportation layer and a cathode are sequentially layered.

The EL element in this specification refers to an element composed of an anode, an EL layer and a cathode.

Now, the circuit operation of the active matrix electronic device is described with reference to FIGS. 14A and 14B. First, the gate signal line 1405 is selected to apply a voltage to a gate electrode of the switching TFT 1401 and turn the switching TFT 1401 conductive. Then signals (voltages) from the source signal line 1406 are accumulated in the storage capacitor 1404. The voltage of the storage capacitor 1404 serves as a gate-source voltage $V_{GS}$ of the EL driving TFT 1402, and hence a current flows in the EL driving TFT 1402 and the EL element 1403 in an amount corresponding to the voltage of the storage capacitor 1404. The EL element 1403 emits light as a result.

The luminance of the EL element 1403, namely, the amount of current flowing through the EL element 1403 can be controlled by $V_{GS}$ of the EL driving TFT 1402. $V_{GS}$ is the voltage of the storage capacitor 1404, which is equals to a signal (voltage) inputted to the source signal line 1406. In short, the luminance of the EL element 1403 is controlled by controlling the signal (voltage) inputted to the source signal line 1406. Lastly, the gate signal line 1405 is brought into not-selected state to close the gate of the switching TFT 1401 and turn the switching TFT 1401 unconductive. At this point, electric charges accumulated in the storage capacitor 1404 are held. Therefore, $V_{GS}$ of the EL driving TFT 1402 is held as it is, and a current flows through the EL driving TFT 1402 into the EL element 1403 in an amount corresponding to $V_{GS}$.

Those described above have been reported in: SID 99 Digest, p. 372, "Current Status and Future of Light-emitting Polymer Display Driven by Poly-Si TFT"; ASIA DISPLAY 98, p. 217, "High Resolution Light Emitting Polymer Display Driven by Low Temperature Polysilicon Thin Film Transistor with Integrated Driver"; Euro Display 99, Late News, p. 27, "3.8 Green OLED with Low Temperature Poly-Si TFT"; etc.

Gray scale display methods for EL displays can be divided into an analog gray scale method and a digital gray scale method. The former method, i.e., the analog gray scale method, changes the luminance in an analog fashion by changing the gate-source voltage $V_{GS}$ of the EL driving TFT 1402 to control the amount of current flowing into the EL element 1403. In contrast thereto, according to the latter method, i.e., the digital gray scale method, there are only two states for the gate-source voltage $V_{GS}$ of the EL driving TFT 1402. It is either that $V_{GS}$ is in a range where the current is not at all allowed to flow in the EL element (less than "light-up start voltage") or that $V_{GS}$ is in a range where the maximum amount of current flows (equal to or larger than "luminance saturation voltage"). Therefore the EL element is in either lights-on state or lights-off state, and there is no other state.

The digital gray scale method is mainly used in EL displays, for image display through this method is hardly affected by fluctuation in TFT characteristics such as threshold value. However, the digital gray scale method by itself is only capable of displaying in two gray scales. Therefore, several techniques have been proposed to provide multi-gray scale display by combining the digital gray scale method with other gray scale methods.

One of those proposals is a combination of the digital gray scale method and an area ratio gray scale method. The area ratio gray scale method is a method in which gray scale is obtained by controlling the area of the lit-up portions. To be specific, the method provides gray scale display by dividing one pixel into a plurality of sub-pixels to control the number or the area of the lit-up sub-pixels. This method has a drawback and there are difficulties in obtaining high resolution and multi-gray scale because the pixel can be divided into only a small number of sub-pixels. This area ratio gray scale method is detailed in: Euro Display 99, Late News, p. 71, "TFT-LEPD with Image Uniformity by Area Ratio Gray Scale"; IEDM 99, p. 107, "Technology for Active Matrix Light Emitting Polymer Displays"; etc.

Another technique for obtaining multi-gray scale with the digital gray scale method is to combine the digital gray scale method with a time gray scale method. The time gray scale method obtains gray scale by utilizing the difference in length of the lights-on periods. To be specific, gray scale is obtained in this method by dividing one frame period into a plurality of sub-frame periods to control the number or length of the sub-frame periods during which EL elements emit light.

The digital gray scale method may be combined with the area ratio gray scale method and the time gray scale method, which is detailed in IDW 99, p. 171, "Low-temperature Poly-Si TFT Driven Light-emitting-polymer Displays and Digital Gray Scale for Uniformity".

FIGS. 15A and 15B are timing charts in a driving method using the combination of digital gray scale and time gray scale. An address (writing) period and a sustain (lights-on) period are completely separated from each other in a sub-frame period shown in FIG. 15A, whereas they are not separated in FIG. 15B.

In driving methods utilizing time gray scale, normally, an address (writing) period and a sustain (lights-on) period are needed for each bit. According to a driving method where an address (writing) period and a sustain (lights-on) period are completely separated from each other (a method where a sustain (lights-on) period in each sub-frame period starts only after an address (writing) period corresponding to one screen writing is completed), the address (writing) periods take up a large portion of one frame period. In addition, as shown in FIG. 15A, the address (writing) period has a period 1501 during which neither writing or lighting is carried out in rows other than a certain row as long as the gate signal line of that certain row is selected. Therefore duty ratio (the ratio of the length of sustain (lights-on) periods in one frame) is very low. There is no other way than increasing the operation clock to shorten the address (writing) periods and, considering margin for the operation of the circuit, only limited gray scale is possible. In contrast to this method, a driving method in which an address (writing) period and a sustain (lights-on) period are not separated from each other starts the sustain (lights-on) period for, e.g., the k-th row EL element immediately after the completion of the gate signal line selecting period for the k-th row gate signal line. Therefore some pixels are lit up during the gate signal line selecting periods for the gate line signals of other rows, which makes this driving method advantageous in light of high duty ratio.

However, the method where an address (writing) period and a sustain (lights-on) period are not separated from each other has the following problem. The length of one address (writing) period extends from the start of the gate signal line selecting period for the first row gate signal line to the completion of the gate signal line selecting period for the last row gate signal line. Two different gate signal lines can not simultaneously be selected at some points. Accordingly, in the driving method where an address (writing) period and a sustain (lights-on) period are not separated from each other, the sustain (lights-on) period has to have a length equal to or longer than the length of the address (writing) period (strictly speaking, a length of a period starting upon completion of writing a signal for the first row gate signal line and ending with completion of writing a signal for the last row gate signal line). Thus there is a limitation in setting the minimum unit for the sustain (lights-on) period when aiming at multi-gray scale. The minimum unit in FIG. 15B corresponds to the length of a period denoted by 1502, where a period ending with completion of an address (writing) period $Ta_4$ of a minimum bit sub-frame period $SF_4$ does not overlap with a period starting upon start of the first address (writing) period of the next frame period. When a sustain (lights-on) period is shorter than the period 1502, normal display cannot be obtained. Since the length of a sustain (lights-on) period is determined by the ratio of power of 2 in the combination of the digital gray scale method and the time gray scale method, obtaining multi-gray scale is difficult within confinement set to the length of one frame period.

SUMMARY OF THE INVENTION

An object of the present invention is to provide a novel driving method mainly using digital gray scale and time gray scale in combination, which secures high duty ratio and which can display an image normally even when a sustain (lights-on) period is shorter than an address (writing) period.

In order to attain the above object, the present invention takes the following measures.

A method of driving an electronic device according to the present invention makes it possible to set the length of a sustain (lights-on) period without being restricted by the length of an address (writing) period in a sub-frame period where a sustain (lights-on) period is shorter than an address (writing) period by squeezing a non-display period for an EL element in between completion of the sustain (lights-on) period and start of an address (writing) period of the next sub-frame period so that the address (writing) periods do not overlap. As a result, the overlap of the address (writing) periods can be avoided and an image can be displayed normally even when a sustain (lights-on) period of less significant bit is shortened because of multi-gray scale.

The structure of an electronic device according to the present invention will be described below.

According to a first aspect of the present invention, there is provided a method of driving an electronic device, with one frame period comprising n sub-frame periods $SF_1, SF_2, \ldots, SF_n$, the n sub-frame periods each comprising address (writing) periods $Ta_1, Ta_2, \ldots, Ta_n$ and sustain (lights-on) periods $Ts_1, Ts_2, \ldots, Ts_n$, characterized in that the address (writing) period overlaps with the sustain (lights-on) period in at least one sub-frame period of the n sub-frame periods, and that, in the case where an address (writing) period $Ta_m$ ($1 \leq m \leq n$) of a sub-frame period $SF_m$ overlaps with an address (writing) period $Ta_{m+1}$ of a sub-frame period $SF_{m+1}$, a clear period $Tc_m$ is provided which starts upon completion of a sustain (lights-on) period $Ts_m$ of the sub-frame period $SF_m$ and ends upon start of the address (writing) period $Ta_{m+1}$.

According to a second aspect of the present invention, there is provided a method of driving an electronic device, with one frame period comprising n sub-frame periods $SF_1, SF_2, \ldots, SF_n$, the n sub-frame periods each comprising address (writing) periods $Ta_1, Ta_2, \ldots, Ta_n$ and sustain (lights-on) periods $Ts_1, Ts_2, \ldots, Ts_n$, characterized in that the address (writing) period overlaps with the sustain (lights-on) period in at least one sub-frame period of the n sub-frame periods, and that, in the case where an address (writing) period $Ta_n$ of a j-th ($0<j$) frame sub-frame period $SF_n$ overlaps with an address (writing) period $Ta_1$ of a (j+1)-th frame sub-frame period $SF_1$, a clear period $Tc_n$ is provided which starts upon completion of a sustain (lights-on) period $Ts_n$ of the j-th frame sub-frame period $SF_n$ and ends upon start of the address (writing) period $Ta_1$ of the (j+1)-th frame sub-frame period $SF_1$.

According to a third aspect of the present invention, there is provided a method of driving an electronic device, with one frame period comprising n sub-frame periods $SF_1, SF_2, \ldots, SF_n$, the n sub-frame periods each comprising address (writing) periods $Ta_1, Ta_2, \ldots, Ta_n$ and sustain (lights-on) periods $Ts_1, Ts_2, \ldots, Ts_n$, characterized in that, in a certain sub-frame period $SF_k$ ($1 \leq k \leq n$), when the length of its address (writing) period is given as $ta_k$, the length of its sustain (lights-up) period as $ts_k$ and the length of one gate signal line selecting period as $t_g$ ($ta_k, ts_k, t_g > 0$), and $ta_k > ts_k$ is satisfied, the length of $SF_K$'s clear period given as $Tc_k$ ($Tc_k > 0$) always satisfies the following expression:

$$tc_k \geq ta_k - (ts_k + t_g)$$

According to a fourth aspect of the present invention, a method of driving an electronic device of any one of the first to third aspects of the invention is characterized in that a clear signal inputted during the clear period is provided by increasing or lowering the electric potential of a storage capacitor line by means of a signal inputted from a storage capacitor line driving circuit.

According to a fifth aspect of the present invention, a method of driving an electronic device of the fourth aspect of the invention is characterized in that an EL element does not emit light during the clear period irrespective of an image signal.

According to a sixth aspect of the present invention, there is provided an electronic device comprising a source signal line side driver circuit, a gate signal line side driver circuit, a storage capacitor line driving circuit, and a pixel portion, characterized in that:

the pixel portion has a plurality of source signal lines, a plurality of gate signal lines, a plurality of current supply lines, a plurality of storage capacitor lines, and a plurality of pixels;

each of the plurality of pixels has a switching transistor, an EL driving transistor, a storage capacitor, and an EL element;

the switching transistor has a gate electrode electrically connected to the gate signal line;

the switching transistor has a source region and a drain region one of which is electrically connected to the source signal line and the other of which is electrically connected to a gate electrode of the EL driving transistor;

the storage capacitor has an electrode electrically connected to the storage capacitor line and has another electrode electrically connected to the gate electrode of the EL driving transistor; and the EL driving transistor has a source region and a drain region one of which is electrically connected to the current supply line and the other of which is electrically connected to one electrode of the EL element.

According to a seventh aspect of the present invention, an electronic device of the sixth aspect of the invention is characterized in that the storage capacitor line is electrically connected to the storage capacitor line driving circuit so that a signal having amplitude is inputted to the storage capacitor line from the storage capacitor line driving circuit.

According to an eighth aspect of the present invention, there is provided an electronic device characterized in that it is operated by a driving method in which:

one frame period comprising n sub-frame periods $SF_1, SF_2, \ldots, SF_n$;

the n sub-frame periods each comprising address (writing) periods $Ta_1, Ta_2, \ldots, Ta_n$ and sustain (lights-on) periods $Ts_1, Ts_2, \ldots, Ts_n$;

the address (writing) period overlaps with the sustain (lights-on) period in at least one sub-frame period of the n sub-frame periods; and, in the case where an address (writing) period $Ta_m$ ($1 \leq m \leq n$) of a sub-frame period $SF_m$ overlaps with an address (writing) period $Ta_{m+1}$ of a sub-frame period $SF_{m+1}$, a clear period $Tc_m$ is provided which starts upon completion of a sustain (lights-on) period $Ts_m$ of the sub-frame period $SF_m$ and ends upon start of the address (writing) period $Ta_{m+1}$.

According to a ninth aspect of the present invention, there is provided an electronic device characterized in that it is operated by a driving method in which:

one frame period comprising n sub-frame periods $SF_1, SF_2, \ldots, SF_n$;

the n sub-frame periods each comprising address (writing) periods $Ta_1, Ta_2, \ldots, Ta_n$ and sustain (lights-on) periods $Ts_1, Ts_2, \ldots, Ts_n$;

the address (writing) period overlaps with the sustain (lights-on) period in at least one sub-frame period of the n sub-frame periods; and, in the case where an address (writing) period $Ta_n$ of a j-th ($0<j$) frame sub-frame period $SF_n$ overlaps with an address (writing) period $Ta_1$ of a (j+1)-th frame sub-frame period $SF_1$, a clear period $Tc_n$ is provided which starts upon completion of a sustain (lights-on) period $Ts_n$ of the j-th frame sub-frame period $SF_n$ and ends upon start of the address (writing) period $Ta_1$ of the (j+1)-th frame sub-frame period $SF_1$.

According to a tenth aspect of the present invention, there is provided an electronic device characterized in that:

one frame period comprising n sub-frame periods $SF_1$, $SF_2$, ..., $SF_n$;

the n sub-frame periods each comprising address (writing) periods $Ta_1$, $Ta_2$, ..., $Ta_n$ and sustain (lights-on) periods $Ts_1$, $Ts_2$, ..., $Ts_n$; and, in a certain sub-frame period $SF_k$ ($1 \leq k \leq n$), when the length of its address (writing) period is given as $ta_k$, the length of its sustain (lights-up) period as $ts_k$, and the length of one gate signal line selecting period as $t_g$ ($ta_k$, $ts_k$, $t_g > 0$), and $ta_k > ts_k$ is satisfied, the length of $SF_K$'s clear period given as $Tc_k$ ($Tc_k > 0$) always satisfies the following expression:

$$tc_k \geq ta_k - (ts_k + t_g)$$

According to an eleventh aspect of the present invention, an electronic device of any one of the eighth to tenth aspects of the invention is characterized in that a clear signal inputted during the clear period is provided by increasing or lowering the electric potential of a storage capacitor line by means of a signal inputted from a storage capacitor line driving circuit.

According to a twelfth aspect of the present invention, an electronic of the eleventh aspect of the invention is characterized in that an EL element does not emit light during the clear period irrespective of an image signal.

BRIEF DESCRIPTION OF THE DRAWINGS

In the accompanying drawings:

FIGS. 3A and 3B are timing charts illustrating a driving method according to Embodiment 2 of the present invention;

FIGS. 4A to 4C are diagrams showing an exemplary process of manufacturing an electronic device in accordance with Embodiment 3;

FIGS. 6A and 6B are diagrams showing the exemplary process of manufacturing an electronic device in accordance with Embodiment 3:

FIG. 7A is a top view thereof and FIG. 7B is a sectional view thereof;

DETAILED DESCRIPTION OF THE PREFERRED EMBODIMENTS

Figure 16A:
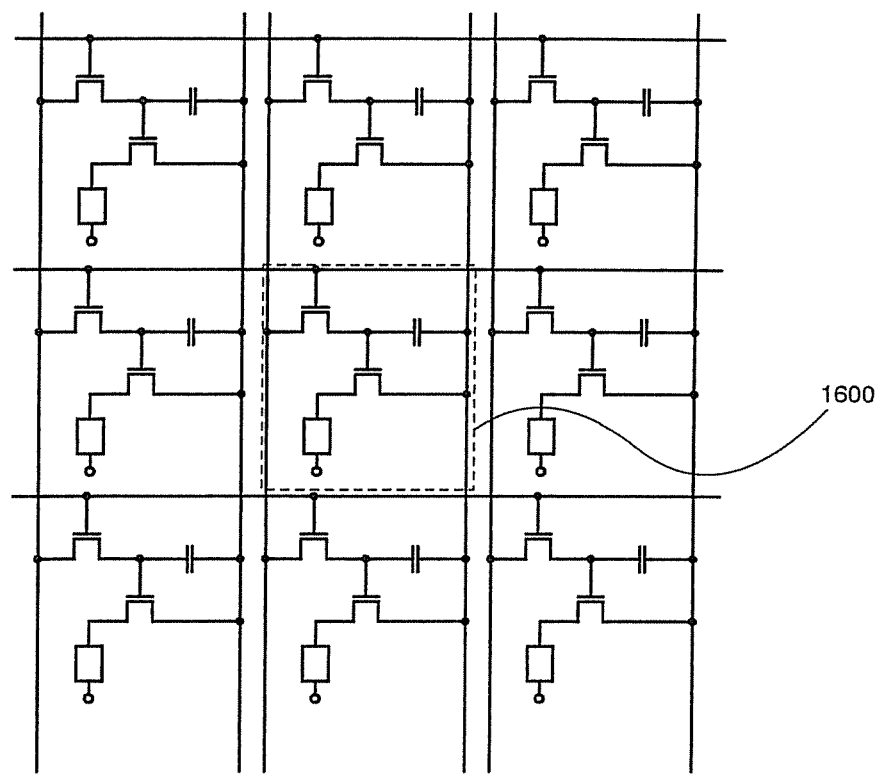
FIGS. 16A and 16B are diagrams showing an example of circuit structure of an electronic device.
Figure 16B:
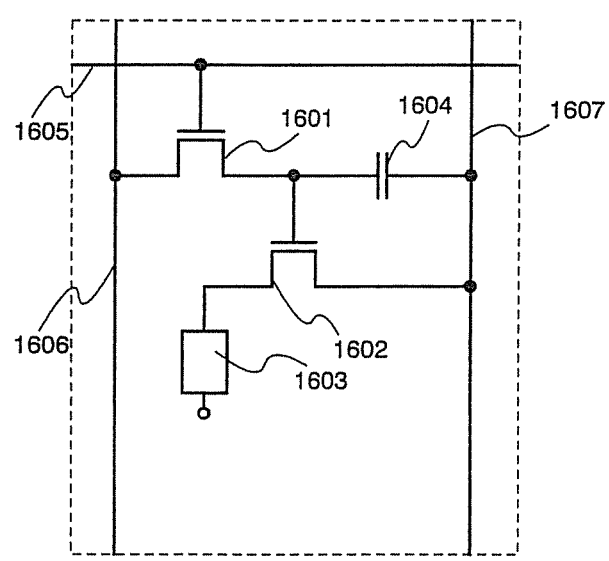
Figure 17A:
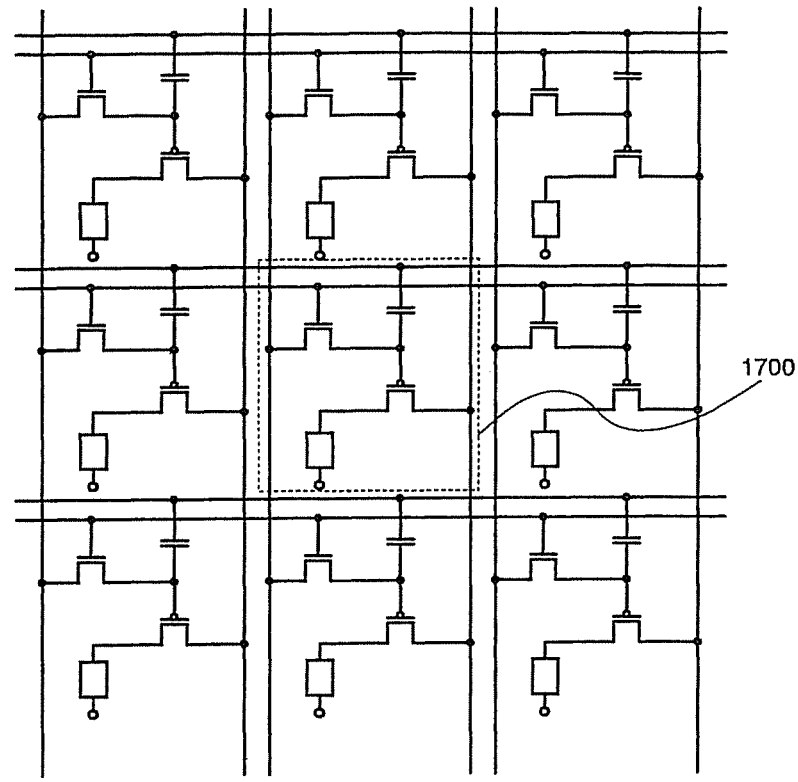
FIGS. 17A and 17B are diagrams showing an example of circuit structure of an electronic device.
Figure 17B:
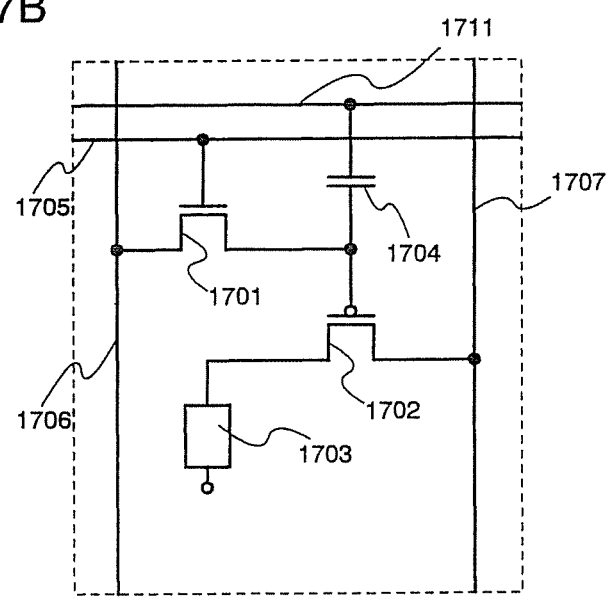

The structure of the present invention will be described. A normal structure of a pixel portion is as shown in FIGS. 16A and 16B in which one terminal of a storage capacitor 1604 is connected to a current supply line 1607. The current supply line usually has its electric potential kept constant. The pixel portion may alternatively be structured as shown in FIGS. 17A and 17B in which a storage capacitor line 1711 is provided and one terminal of a storage capacitor 1704 is connected to the storage capacitor line. In this case, the electric potential of the storage capacitor line 1711 is kept constant.

The present invention adopts the circuit structure of FIGS. 17A and 17B, and no particular addition is required. However, this circuit structure is modified in the present invention such that the electric potential of the storage capacitor line 1711 is not always constant and a signal can be inputted using a circuit.

The electric potential of the storage capacitor line 1711 is kept constant during an address (writing) period and a sustain (lights-on) period. When a non-display period is provided irrespective of a gate voltage of an EL driving TFT 1702, the electric potential of the storage capacitor line 1711 is increased. (This applies to the case where the EL driving TFT 1702 is a p-channel TFT. If an n-channel TFT is used instead, the reverse operation takes place.) This will be called a clear signal and a period during which the clear signal is inputted will be called a clear period. Accompanying with this increase in electric potential, a gate-source voltage $V_{GS}$ of the EL driving TFT 1702 electrically connected to the storage capacitor 1704 is also increased to force it into OFF state. Supply of current to an EL element 1703 is thus stopped in this period irrespective of a signal being written, thereby providing a clear period.

When the electric potential of the storage capacitor line 1711 is kept constant during an address (writing) period and a sustain (lights-on) period, somewhat low electric potential is preferable. The electric potential of the storage capacitor line has to be increased upon inputting a clear signal to a value higher than in the period A, i.e., the period during which the electric potential of the storage capacitor line 1711 is kept constant. If the electric potential in the period A is high from the start, it has to be increased even higher in inputting a clear signal. Therefore the electric potential is preferably low in the period A. (This applies to the case where the EL driving TFT 1702 is a p-channel TFT. Since the reverse operation takes place when an n-channel TFT is used instead, the electric potential is preferably kept high in the period A in this case.)

According to the driving method of the present invention, a clear signal is inputted to the storage capacitor line 1711 to squeeze in a clear period. Therefore a sustain (lights-on) period shorter than an address (writing) period can easily be set by changing the length of the clear period. This and the high duty ratio described above together work very favorably in obtaining multi-gray scale.

In order to prevent the EL element 1703 from emitting light whatever signal is inputted from the signal line, for instance, the difference in electric potential between an anode 1709 of the EL element and a cathode 1710 thereof is set to zero. Another example is to cut off supply of current to the EL element 1703 by providing a current cutting TFT between the EL driving TFT 1702 and the EL element 1703 and turning the current cutting TFT unconductive. However, in these methods, the periods may not be in timing with each other if the waveform of a signal inputted is dulled (referring to a phenomenon in which a signal is delayed or dulled upon rising or falling of a pulse). This problem becomes more prominent as the length of the respective periods is set shorter. Moreover, the aperture ratio of the pixel may be lowered depending on the type of the current cutting TFT. In contrast thereto, the driving method of the present invention prevents the EL element from emitting light by changing the electric potential of the storage capacitor line to release the electric charges from the storage capacitor. Therefore it is not necessary to control the electric potential of a signal line related to an image (video) signal for the non-display period. The dulled signal waveform thus does not affect the present invention, nor the current cutting TFT that may lower the aperture ratio is necessary.

Next, the electric potential pattern of the respective portions will be described with reference to FIGS. 18A and 18B. The circuit discussed here is of FIGS. 17A and 17B again.

Figure 18A:
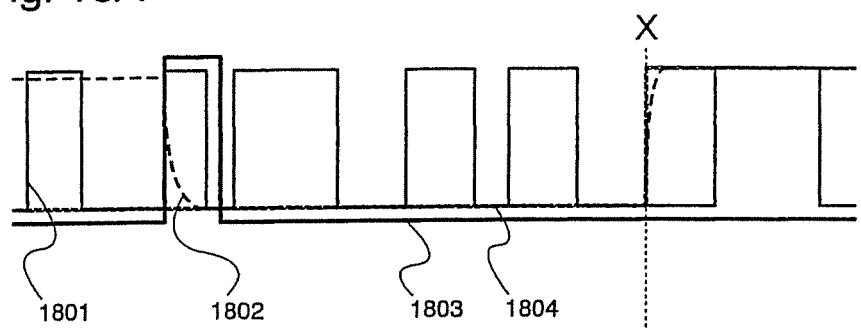
FIGS. 18A and 18B are diagrams illustrating the electric potential of signals in the respective portions in a driving method of the present invention.
Figure 18B:
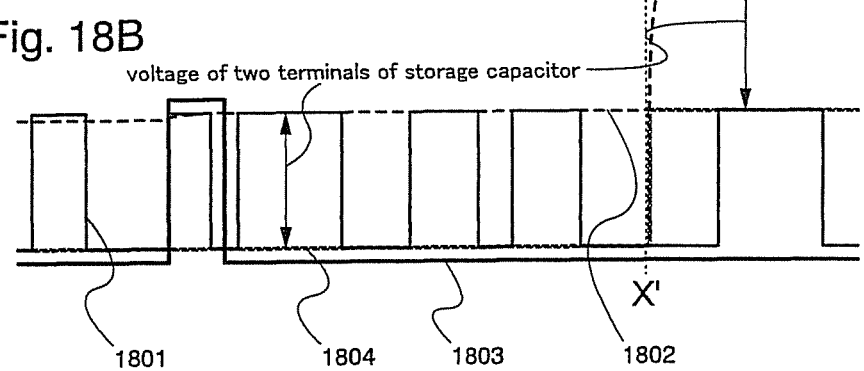

In FIGS. 18A and 18B, reference symbol 1801 denotes the electric potential of the source signal line 1706, 1802 denotes the electric potential of a gate electrode of the EL driving TFT 1702, 1803 denotes the electric potential of the gate signal line 1705, and 1804 denotes the electric potential of the storage capacitor line 1711. Shown in FIGS. 18A and 18B is the case in which the polarity of the switching TFT 1701 is of n-channel whereas the polarity of the EL driving TFT 1702 is of p-channel. First, The electric potential 1804 of the storage capacitor line 1711 is kept to a certain value. The electric potential thereof is desirably kept low, for it has to be increased later. Signals are then inputted to the source signal line 1706 and the gate signal line 1705, and writing into pixels is started.

FIG. 18A shows the case in which a LO signal is inputted to the gate electrode of the EL driving TFT 1702 whereas FIG. 18B shows the case in which a Hi signal is inputted to the gate electrode of the EL driving TFT 1702. In FIG. 18A, as the gate signal line 1705 is selected, a LO signal is inputted to the gate electrode of the EL driving TFT 1702 to lower the electric potential thereof and turn it conductive so that the EL element 1703 starts to emit light. On the other hand, in FIG. 18B, a Hi signal is inputted to the gate electrode of the EL driving TFT 1702 to turn it unconductive as the gate signal line 1705 is selected. Therefore the EL element 1703 does not emit light. Then the period for selecting the gate signal line 1705 comes to an end, lowering the electric potential of the gate signal line 1705. However, the electric potential applied to the gate electrode of the EL driving TFT 1702 is kept, owing to the storage capacitor 1704, to the same value as the period during which the gate signal line 1705 is selected, so that the EL element 1703 continues to emit light in the case of FIG. 18A and lights-off state is continued in the case of FIG. 18B.

Described next is behavior of the respective portions before and after a clear period in the present invention. The electric potential 1804 of the storage capacitor line 1711 is increased at points indicated by the dotted line X-X' in FIGS. 18A and 18B. It is desirable here to set the amplitude of the electric potential 1804 of the storage capacitor line 1711 larger than the amplitude of the electric potential of the source signal line 1706. At this point, the period for selecting the gate signal line 1705 has ended and the switching TFT 1701 has already been turned unconductive. The voltage between the two terminals of the storage capacitor 1704 is stored as it is, and an increase in electric potential 1804 of the storage capacitor line 1711 connected to one terminal of the storage capacitor causes an increase in electric potential of the other terminal thereof, namely, an increase in gate voltage 1802 of the EL driving TFT 1702. Therefore the electric potential 1802 of the gate electrode of the EL driving TFT 1702 is risen at the point indicated by the dotted line X-X' in FIG. 18A. This makes the EL driving TFT 1702 unconductive, thereby stopping supply of current to the EL element 1703 and bringing it into lights-off state. Similarly, in FIG. 18B, an increase in electric potential 1804 of the storage capacitor line 1711 is accompanied with an increase in electric potential 1802 of the gate electrode of the EL driving TFT 1702. However, no change is caused in this case and the non-display state continues.

Through such an operation, the EL element 1703 can be forced into non-display state even when the gate signal line 1705 is selected and a signal from the source signal line 1706 is being written in pixels in another row. Accordingly, the length of a sustain (lights-on) period can be set to any arbitrary value by changing the length of the clear period.

Although an n-channel TFT is used for the switching TFT 1701 in the cases shown in FIGS. 18A and 18B, the driving method of the present invention can work normally without any problem also when a p-channel TFT is used for the switching TFT. This case will be described below with reference to FIGS. 19A and 19B. The circuit discussed here is of FIGS. 17A and 17B once again.

First, an electric potential 1904 of the storage capacitor line 1711 is kept constant. The electric potential 1904 is kept low from the reason describe above. Then signals are inputted to the source signal line 1706 and the gate signal line 1705 and writing into pixels is started.

Figure 19A:
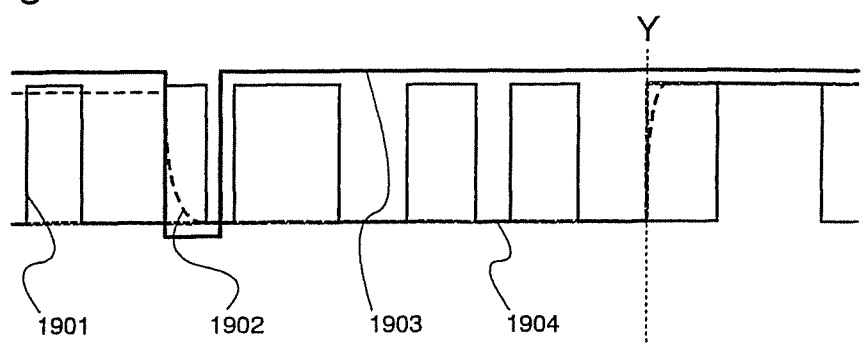
FIGS. 19A and 19B are diagrams illustrating the electric potential of signals in the respective portions in a driving method of the present invention.
Figure 19B:
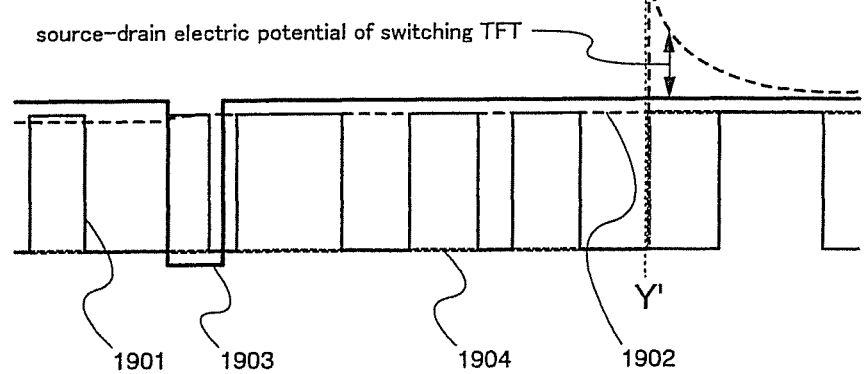

FIG. 19A shows the case in which a LO signal is inputted to the gate electrode of the EL driving TFT 1702 whereas FIG. 19B shows the case in which a Hi signal is inputted to the gate electrode of the EL driving TFT 1702. In FIG. 19A, as the gate signal line 1705 is selected, a LO signal is inputted to the gate electrode of the EL driving TFT 1702 to lower the electric potential thereof and turn it conductive so that the EL element 1703 starts to emit light. On the other hand, in FIG. 19B, a Hi signal is inputted to the gate electrode of the EL driving TFT 1702 to turn it unconductive as the gate signal line 1705 is selected. Therefore the EL element 1703 does not emit light. Then the period for selecting the gate signal line 1705 comes to an end, lowering the electric potential of the gate signal line 1705. However, the electric potential applied to the gate electrode of the EL driving TFT 1702 is kept, owing to the storage capacitor, to the same value as the period during which the gate signal line 1705 is selected, so that the EL element 1703 continues to emit light in the case of FIG. 19A and lights-off state is prolonged in the case of FIG. 19B.

Described next is behavior of the respective portions before and after a clear period in the present invention. The electric potential 1904 of the storage capacitor line 1711 is increased at points indicated by the dotted line Y-Y' in FIGS. 19A and 19B. At this point, the period for selecting the gate signal line 1705 has ended and the switching TFT 1701 has already been turned unconductive. The voltage between the two terminals of the storage capacitor 1704 is stored as it is, and an increase in electric potential 1904 of the storage capacitor line 1711 connected to one terminal of the storage capacitor causes a simultaneous increase in gate voltage 1902 of the EL driving TFT 1702. Thus the electric potential 1902 of the gate electrode of the EL driving TFT 1702 is increased at the point indicated by the dotted line Y-Y' in FIG. 19A. This makes the EL driving TFT 1702 unconductive, thereby stopping supply of current to the EL element 1703 and bringing it into lights-off state. In FIG. 19B, an increase in electric potential of the storage capacitor line 1711 causes a simultaneous increase in electric potential 1902 of the gate electrode of the EL driving TFT 1702. This also causes an increase in electric potential on the source side of the switching TFT 1701. Since the polarity of the switching TFT 1701 here is of p-channel, the switching TFT 1701 is temporarily turned conductive when the source side electric potential is increased. This brings a change toward equalization of the source-drain electric potential of the switching TFT 1701. In other words, the electric potential 1902 of the gate electrode of the EL driving TFT 1702 is lowered. An electric potential 1903 of the gate signal line 1705 is constant at this point, and hence a decrease in electric potential 1902 of the gate electrode of the EL driving TFT 1702 is accompanied with a decrease in electric potential on the source side of the switching TFT 1701. This brings a change toward reduction in gate-source voltage of the switching TFT 1702. When the gate-source voltage reaches lower than the threshold voltage of the switching TFT 1701, the switching TFT 1701 is returned to unconductive state. The respective portions behave as above when a p-channel TFT is used for the switching TFT 1701. Whichever polarity the switching TFT 1701 takes, the EL driving TFT 1702 is turned unconductive when the electric potential of the storage capacitor line 1711 is increased.

As has been described, the driving method of the present invention can work normally irrespective of whether the polarity of the switching TFT 1701 is of n-channel or p-channel.

The present invention has been described in this embodiment mode taking as an example the case where the time gray scale method and the digital gray scale method are used in combination. If the area ratio gray scale method is added thereto, it is still possible to bring the EL element into non-display state through the same manner.

Now, descriptions are given on embodiments of the present invention.

Embodiment 1

Figure 20A:
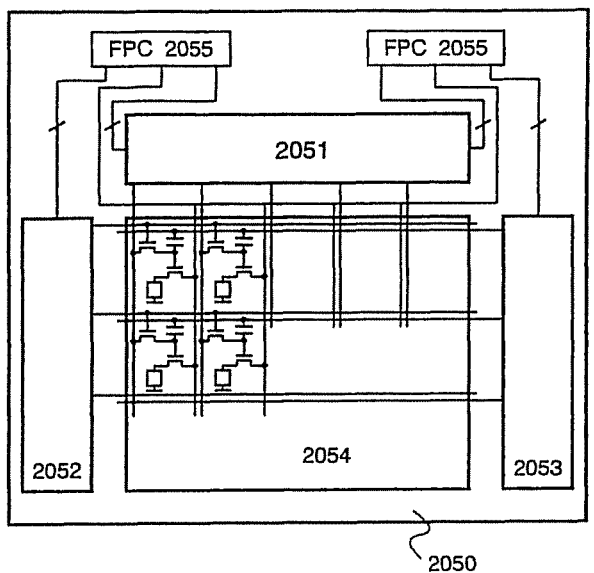
FIGS. 20A and 20B are diagrams showing an example of circuit structure of an electronic device according to Embodiment 1.
Figure 20B:
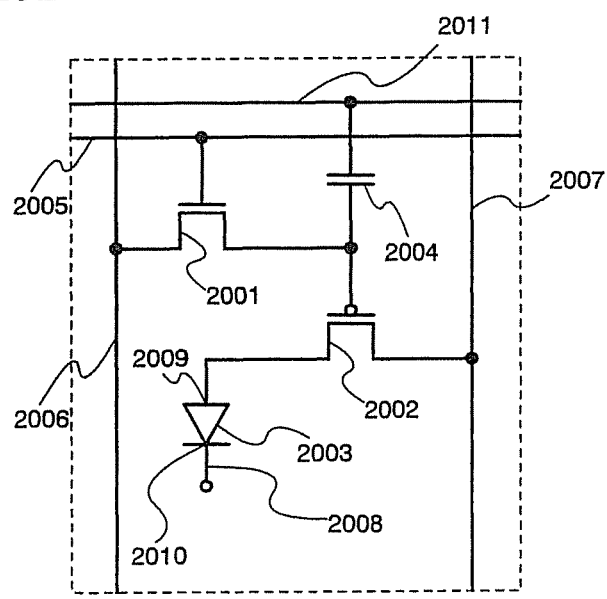

FIG. 20A shows an example of the entire circuit structure. A pixel portion is placed at the center. FIG. 20B is a circuit diagram of one pixel enclosed in a dotted line frame 2000. A source signal line side driver circuit is arranged above the pixel portion. A gate signal line side driver circuit is put to the left of the pixel portion. A storage capacitor line driving circuit is set to the right of the pixel portion.

The actual driving method will be described using a timing chart. Discussed here is a driving method that uses digital gray scale and time gray scale in combination to obtain n bit gray scale display. For simplification, n is set to 3 here and display of $2^3=8$ gray scales will be described. The circuit diagrams of FIGS. 20A and 20B are referred to again.

Figure 1:
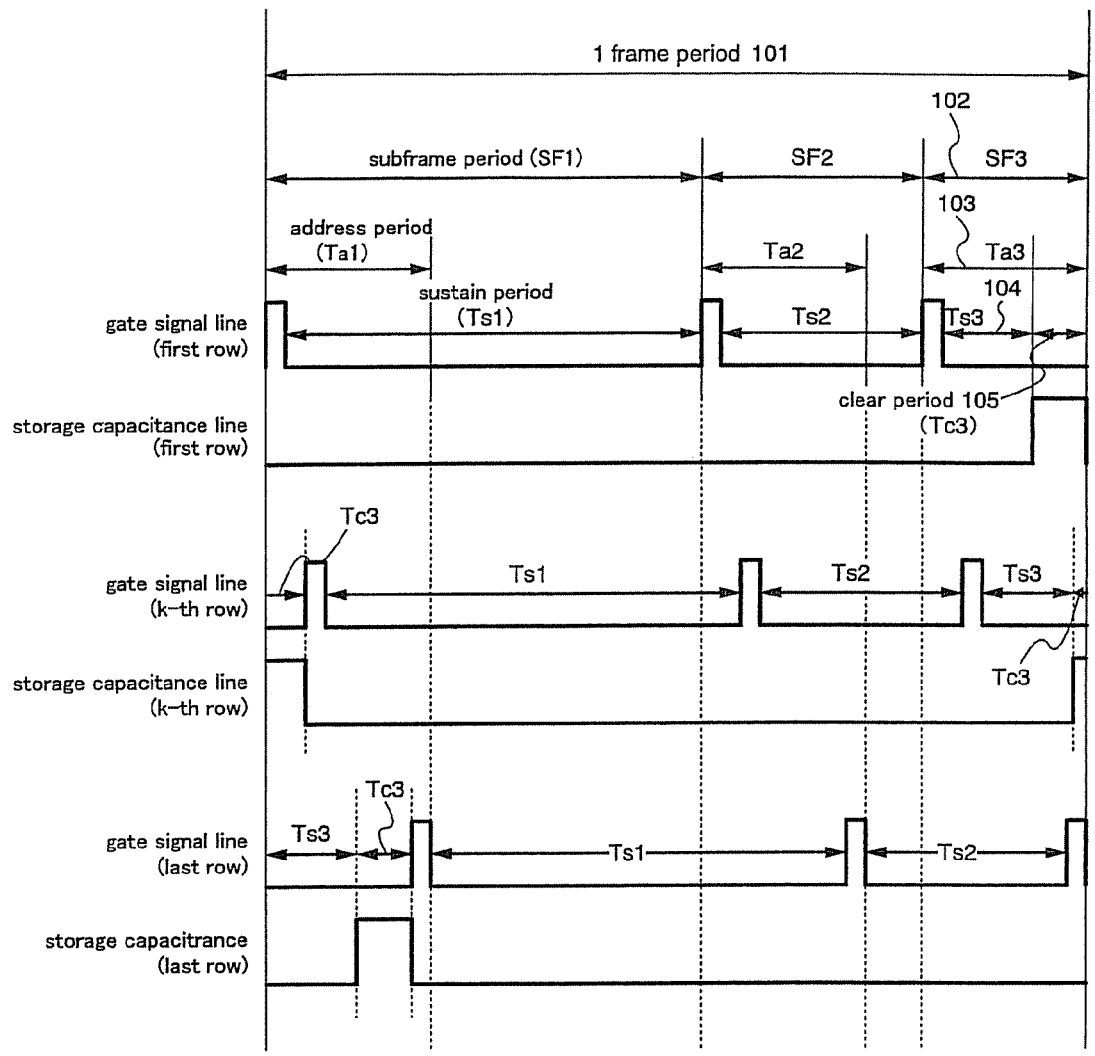
FIG. 1 is a timing chart illustrating a driving method according to Embodiment 1 of the present invention.

FIG. 1 is a timing chart of the electric potential of the gate signal line and of the storage capacitor line in the respective rows in this case. According to the circuit used in this embodiment, a switching TFT 2001 is an n-channel TFT. Therefore, in a gate signal line selecting period, the electric potential of a gate signal line 2005 is increased and the switching TFT 2001 is turned conductive.

The descriptions are given in temporal order. First, one frame period has to be divided into n sub-frames in order to obtain n bit gray scale display. In this embodiment, n bit is 3 bit and one frame is divided into 3 sub-frame periods $SF_1$ to $SF_3$. Each sub-frame period has address (writing) periods $Ta_1$ to $Ta_3$ and sustain (lights-on) periods $Ts_1$ to $Ts_3$. An address (writing) period is a period required for writing of one screen, and hence each address (writing) period has the same length as another address (writing) period. The length of the sustain (lights-on) periods is determined in accordance with power of 2. Specifically, $Ts_1:Ts_2:Ts_3=4:2:1$ in the case of FIG. 1.

However, the length of the sustain (lights-on) period may not always follow the power of 2 to obtain gray scale display.

In the timing chart according to this embodiment, an address (writing) period and a sustain (lights-on) period are not completely separated from each other and one of the sustain (lights-on) periods is shorter than an address (writing) period. The gate signal line 2005 is first selected one by one in $SF_1$, during which signals are written into pixels. When writing into pixels of one row is completed (when the gate signal line selecting period is ended), this row enters the sustain (lights-on) period $Ts_1$.

Upon ending of the sustain (lights-on) period $Ts_1$ in $SF_1$, $SF_2$ is started and, as in $SF_1$, the gate signal line 2005 is selected one by one to write signals into pixels. During the signals are written, the electric potential of a storage capacitor line 2011 is kept constant.

Figure 2A:
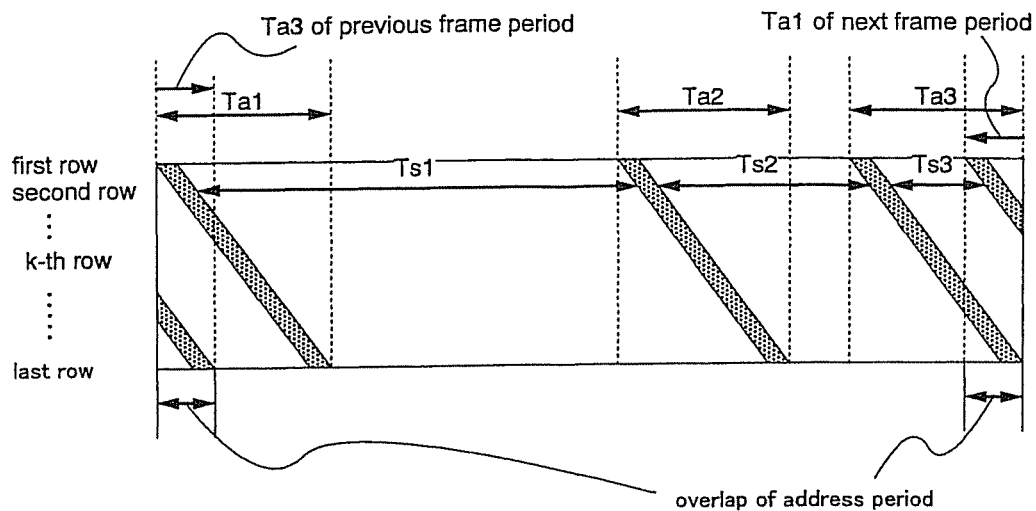
FIGS. 2A and 2B are timing charts illustrating the driving method according to Embodiment 1 of the present invention.

Thereafter $SF_3$ is started. In $SF_3$, as shown in FIG. 1. the sustain (lights-on) period $Ts_3$ is shorter than the address (writing) period $Ta_3$. Then if the sustain (lights-on) period is started after completion of the address (writing) period and the next sub-frame period is started immediately after the sustain (lights-on) period is ended as in the foregoing sub-frame periods, the address (writing) period $Ta_1$ in $SF_1$ of the next frame period is started before completion of the address (writing) period $Ta_3$ in $SF_3$ as shown in FIG. 2A. Thus address (writing) periods of different sub-frames partially overlap with each other. The existence of this overlap period means that there are gate signal lines of two different rows which are simultaneously selected, and threatens normal image display.

Therefore a period during which an EL element 2003 does not emit light is squeezed in between the end of a certain period (sustain (lights-on) period) from the completion of $Ts_3$ and start of the next address (writing) period by increasing the electric potential of the storage capacitor line 2011. This period for clearing the EL element 2003 is referred to as clear period $Tc_n$ (n corresponds to the sub-frame number).

Figure 2B:
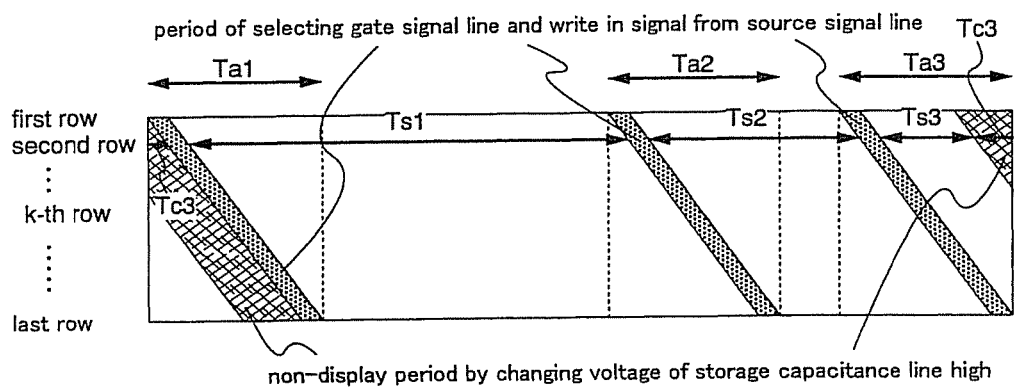

In FIG. 2B, Tc3 is provided after the end of Ts$_3$ so that overlap of Ta$_3$ with the next Ta$_1$ can be avoided and normal image display can be ensured.

The clear period is limited in length and it always has to satisfy tc$_k$≥ta$_k$−(ts$_k$+t$_g$), where ta$_k$ is the length of an address (writing) period Ta$_k$ of a sub-frame period SF$_k$ (1≤k≤n), Ta$_k$ being shorter than a sustain (lights-on) period Ts$_k$ thereof, ts$_k$ is the length of the sustain (lights-on) period Ts$_k$, t$_g$ is the length of one gate signal line selecting period (ta$_k$, ts$_k$, t$_g$>0), and tc$_k$ (tc$_k$>0) is the length of a clear period in SF$_k$.

Embodiment 2

Described in Embodiment 2 is a case in which the number of gray scales is larger than in Embodiment 1, and there are plural sustain (lights-on) periods each of which is shorter than an address (writing) period. The circuit here is the same as the one in Embodiment 1 and reference is again made to FIGS. 20A and 20B.

In this embodiment, display of 5 bit ($2^5$=32) gray scales is discussed. Similar to the case of 3 bit gray scale display, address (writing) periods Ta1 to Ta5 all have the same length and sustain (lights-on) periods Ts$_1$ to Ts$_5$ are set so as to satisfy Ts$_1$:Ts$_2$:Ts$_3$:Ts$_4$:Ts$_5$=16:8:4:2:1. Out of all the sustain (lights-on) periods, Ts$_3$, Ts$_4$ and Ts$_5$ are each shorter than an address (writing) period.

In a driving method in which the EL element 2003 starts to emit light immediately after writing of signals is completed, if the next address (writing) period is started after the end of a sustain (lights-on) period, address (writing) periods of different sub-frame periods partially overlap with each other as shown in FIG. 3A. Ta3 and Ta4 overlap with each other in a range denoted by a in FIG. 3A, Ta4 and Ta5 overlap with each other in a range denoted by b, and Ta4 and Ta5 and Ta1 of the next sub-frame period (Ta1') overlap in a range denoted by c. The length of the minimum unit sustain (lights-on) period becomes shorter as the number of gray scales is increased, and three or more address (writing) periods may overlap as above. Therefore, similar to Embodiment 1, clear periods Tc3, Tc4 and Tc5 are provided as shown in FIG. 3B in the respective periods between the end of the sustain (lights-on) period and start of the next address (writing) period. The overlap of address (writing) periods thus can be avoided and normal image display can be ensured.

Embodiment 3

A method of manufacturing TFTs of a driver circuit (n-channel type TFT or p-channel type TFT) provided in the pixel portion and the periphery of a pixel portion on the same substrate is explained in detail in this embodiment.

First, as shown in FIG. 4A, a base film 5002 made of an insulating film such as a silicon oxide film, a silicon nitride film, or a silicon oxynitride film is formed on a substrate 5001 made from glass, such as barium borosilicate glass or aluminum borosilicate glass, typically Corning Corp. #7059 glass or #1737 glass. For example, a silicon oxynitride film 5002a manufactured from SiH$_4$, NH$_3$, and N$_2$O by plasma CVD is formed with a thickness of 10 to 200 nm (preferably from 50 to 100 nm), and a hydrogenized silicon oxynitride film 5002b with a thickness of 50 to 200 nm (preferably between 100 and 150 nm), manufactured from SiH$_4$ and N$_2$O, is similarly formed and laminated. The base film 5002 with the two layer structure is shown in Embodiment 3, but the base film 5002 may also be formed as a single layer of one of the above insulating films, and it may be formed having a lamination structure in which two or more layers are laminated.

Island shape semiconductor layers 5003 to 5006 are formed of crystalline semiconductor film manufactured by using a laser crystalline method or a known thermal crystallization method with a semiconductor film having an amorphous structure. The thickness of the island shape semiconductor layers 5003 to 5006 is set from 25 to 80 nm (preferably between 30 and 60 nm). There are no limitations on the crystalline semiconductor film material, but it is preferable to form the film from a semiconductor material such as silicon or a silicon germanium (SiGe) alloy.

A laser such as a pulse oscillation type or continuous emission type excimer laser, a YAG laser, or a YVO$_4$ laser can be used as a laser light source in manufacturing the crystalline semiconductor film with the laser crystallization method. A method of condensing laser light emitted from a laser oscillator into a linear shape by an optical system and then irradiating the light to the semiconductor film may be employed when these types of lasers are used. The crystallization conditions may be suitably selected by the operator. However, the pulse oscillation frequency is set to 30 Hz, and the laser energy density is set form 100 to 400 mJ/cm$^2$ (typically between 200 and 300 mJ/cm$^2$) when using the excimer laser. Further, the second harmonic is utilized when using the YAG laser, the pulse oscillation frequency is set from 1 to 10 KHz, and the laser energy density may be set from 300 to 600 mJ/cm$^2$ (typically between 350 and 500 mJ/cm$^2$). The laser light which has been condensed into a linear shape with a width of 100 to 1000 μm, for example 400 μm, is then irradiated onto the entire surface of the substrate. This is performed with an overlap ratio of 80 to 98% for the linear laser light.

A gate insulating film 5007 is formed covering the island shape semiconductor layers 5003 to 5006. The gate insulating film 5007 is formed of an insulating film containing silicon a thickness of 40 to 150 nm by plasma CVD or sputtering. A 120 nm thick silicon oxynitride film is formed in Embodiment 3. The gate insulating film is not limited to this type of silicon oxynitride film, of course, and other insulating films containing silicon may also be used, in a single layer or in a lamination structure. For example, when using a silicon oxide film, it can be formed by plasma CVD with a mixture of TEOS (tetraethyl orthosilicate) and O$_2$, at a reaction pressure of 40 Pa, with the substrate temperature set from 300 to 400° C., and by discharging at a high frequency (13.56 MHz) electric power density of 0.5 to 0.8 W/cm$^2$. Good characteristics as a gate insulating film can be obtained by subsequently performing thermal annealing, at between 400 and 500° C., of the silicon oxide film thus manufactured.

A first conductive film 5008 and a second conductive film 5009 are then formed on the gate insulating film 5007 in order to form gate electrodes. The first conductive film 5008 is formed from Ta with a thickness of 50 to 100 nm, and the second conductive film 5009 is formed by W with a thickness of 100 to 300 nm, in Embodiment 3.

The Ta film is formed by sputtering, and sputtering with a Ta target is performed by using Ar. If appropriate amounts of Xe and Kr are added to the Ar during sputtering, the internal stress of the Ta film will be relaxed, and film peeling can be prevented. The resistivity of a phase Ta film is on the order of 20 μΩcm, and it can be used in the gate electrode, but the resistivity of β phase Ta film is on the order of 180 μΩcm and it is unsuitable for the gate electrode. The a phase Ta film can easily be obtained if a tantalum nitride film, which possesses a crystal structure near that of a phase Ta, is formed with a thickness of 10 to 50 nm as a base for Ta in order to form the phase Ta film.

A W film is formed by sputtering with a W target. The W film can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 $\mu\Omega$cm. The resistivity can be lowered by enlarging the crystals of the W film, but for cases in which there are many impurity elements such as oxygen within the W film, crystallization is inhibited, and the film becomes high resistance. A W target having a purity of 99.9999% is thus used in sputtering. In addition, the W film is formed while sufficient care is taken in order that no impurities from within the gas phase are introduced at the time of film formation. Thus, a resistivity of 9 to 20 $\mu\Omega$cm can be achieved.

Note that, although the first conductive film 5008 is Ta and the second conductive film 5009 is W in Embodiment 3, the conductive films are not limited to these. Both the first conductive film 5008 and the second conductive film 5009 may also be formed from an element selected from the group consisting of Ta, W, Ti, Mo, Al, and Cu, from an alloy material having one of these elements as its main constituent, or from a chemical compound of these elements. Further, a semiconductor film, typically a polysilicon film, into which an impurity element such as phosphorous is doped may also be used. Examples of preferable combinations other than that used in Embodiment 3 include: a combination of the first conductive film formed from tantalum nitride (TaN) and the second conductive film formed from W; a combination of the first conductive film formed from tantalum nitride (TaN) and the second conductive film formed from Al; and a combination of the first conductive film formed from tantalum nitride (TaN) and the second conductive film formed from Cu.

A mask 5010 is formed next from resist, and a first etching process is performed in order to form electrodes and wirings. An ICP (inductively coupled plasma) etching method is used in Embodiment 3. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias. The W film and the Ta film are both etched on the same order when $CF_4$ and $Cl_2$ are combined.

Edge portions of the first conducting layer and the second conducting layer are made into a tapered shape in accordance with the effect of the bias voltage applied to the substrate side with the above etching conditions by using a suitable resist mask shape. The angle of the tapered portions is from 15 to 45. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011*a* to 5016*a* and second conductive layers 5011*b* to 5016*b*) composed of the first conducting layer and the second conducting layer are thus formed by the first etching process. Portions of the gate insulating film 5007 not covered by the first shape conductive layers 5011 to 5016 are etched on the order of 20 to 50 nm, forming thinner regions. (See FIG. 4A.)

A first doping process is then performed, and an impurity element which imparts n-type conductivity is added. (See FIG. 4B.) Ion doping or ion injection may be performed as the doping method. Ion doping is performed at conditions in which the dosage is set to $1\times10^{13}$ to $5\times10^{14}$ atoms/cm$^2$, and an acceleration voltage is set between 60 and 100 keV. An element residing in group 15 of the periodic table, typically phosphorous (P) or arsenic (As), is used as the n-type conductivity imparting impurity element. Phosphorous (P) is used here. The conductive layers 5011 to 5015 become masks with respect to the n-type conductivity imparting impurity element, and first impurity regions 5017 to 5025 are formed in a self-aligning manner. The impurity element which imparts n-type conductivity is added to the first impurity regions 5017 to 5025 at a concentration within a range of $1\times10^{20}$ and $1\times10^{21}$ atoms/cm$^3$.

A second etching process is performed next as shown in FIG. 4C. The ICP etching method is similarly used; a mixture of $CF_4$, $Cl_2$, and $O_2$ is used as the etching gas, and a plasma is generated by supplying a 500 W RF electric power (13.56 MHz) to a coil shape electrode at a pressure of 1 Pa. A 50 W RF electric power (13.56 MHz) is applied to the substrate side (test piece stage), and a self-bias voltage which is lower in comparison with the first etching process is applied. The W film is etched anisotropically under these etching conditions, and Ta (the first conductive layers) is anisotropically etched at a slower etching speed, forming second shape conductive layers 5026 to 5031 (first conductive layers 5026*a* to 5031*a* and second conductive layers 5026*b* to 5031*b*). The gate insulating film 5007 is additionally etched on the order of 20 to 50 nm, forming thinner regions, in regions not covered by the second shape conductive layers 5026 to 5031.

The etching reaction of the W film or the Ta film in accordance with the mixed gas of $CF_4$ and $Cl_2$ can be estimated from the generated radicals, or from the ion types and vapor pressures of the reaction products. Comparing the vapor pressures of W and Ta fluorides and chlorides, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions are generated. As a result, the etching speed of the W film having a high fluoride vapor pressure becomes high. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds of the W film and the Ta film, and it becomes possible to make the etching speed of the W film larger than that of the Ta film.

Figures 5A, 5B, 5C:
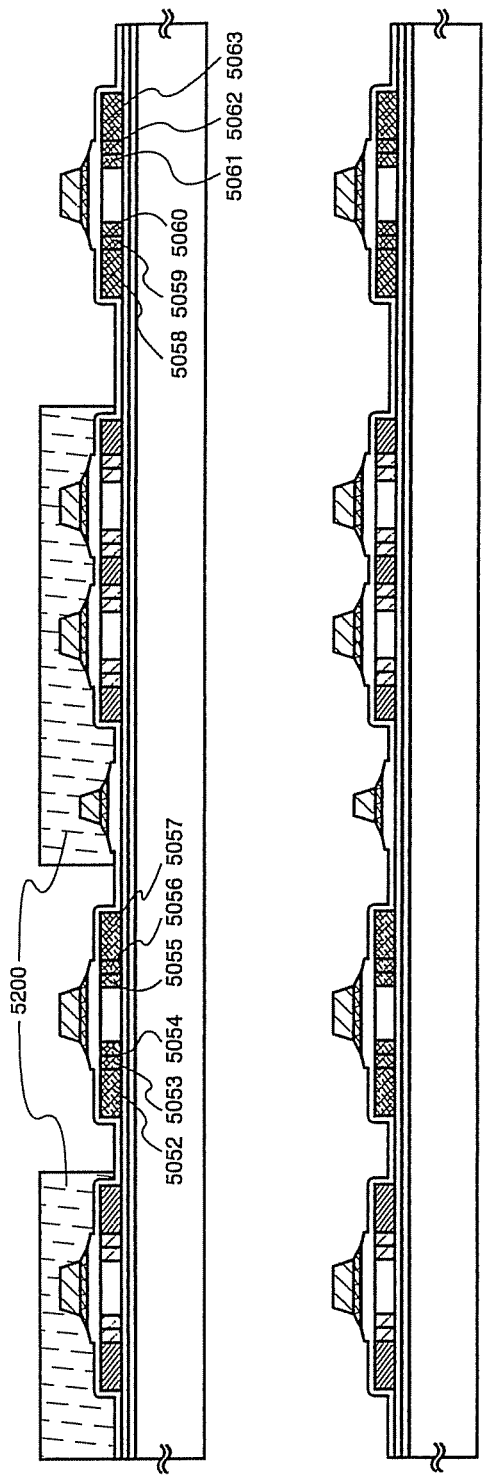
FIGS. 5A to 5C are diagrams showing the exemplary process of manufacturing an electronic device in accordance with Embodiment 3.

A second doping process is then performed as shown in FIG. 5A. In this case, an impurity element which imparts n-type conductivity is doped under conditions of a lower dosage than that in the first doping process, and at a higher acceleration voltage than that in the first doping process. For example, doping may be performed at an acceleration voltage of 70 to 120 keV and with a dosage of $1\times10^{13}$ atoms/cm$^2$, forming new impurity regions inside the first impurity regions formed in the island shape semiconductor layers of FIG. 11B. Doping is performed with the second shape conductive layers 5026 to 5030 as masks with respect to the impurity element, and doping is done such that the impurity element is also added to regions below the second conductive layers 5026a to 5030a. Third impurity regions 5032 to 5041, which overlap with the second conductive layers 5026a to 5030a, and second impurity regions 5042 to 5051 between the first impurity regions and the third impurity regions are thus formed. The n-type conductivity imparting impurity element is added at a concentration of $1 \times 10^{17}$ to $1 \times 10^{19}$ atoms/cm$^3$ in the second impurity regions, and at a concentration of $1 \times 10^{16}$ to $1 \times 10^{18}$ atoms/cm$^3$ in the third impurity regions.

Then, as shown in FIG. 5B, fourth impurity regions 5052 to 5063, having a conductivity type opposite to the single conductivity type, are formed in the island shape semiconductor layers 5004 and 5006, which form p-channel TFTs. The second conductive layers 5027b and 5030b are used as masks against the impurity element, and the impurity regions are formed in a self-aligning manner. The island shape semiconductor layer 5003 and 5005 which forms an n-channel TFT, and the second conducting layer 5031 which forms a wiring, have their entire surfaces covered by a resist mask 5200 at this point. Phosphorous is added at differing concentrations to the impurity regions 5052 to 5063, respectively, by ion doping using diborane ($B_2H_6$). The impurity concentration in all of the regions is set so as to be from $2 \times 10^{20}$ to $2 \times 10^{21}$ atoms/cm$^3$.

The impurity regions are formed in the respective island shape semiconductor layers by the above processes. The second shape conductive layers 5026 to 5030, which overlap with the island shape semiconductor layers, function as gate electrodes. Further, the numeral 5031 functions as a source signal line.

A process of activating the impurity elements added to the respective island shape semiconductor layers is then performed as shown in FIG. 5C, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen environment at 400 to 700° C., typically between 500 and 600 C. Heat treatment is performed for 4 hours at 500° C. in Embodiment 3. However, for cases in which the wiring material used in the second shape layers 5026 to 5031 is weak with respect to heat, it is preferable to perform activation after forming an interlayer insulating film (having silicon as its main constituent) in order to protect the wirings.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

As shown in FIG. 6A, the first interlayer insulating film 5064 is formed to 100 to 200 nm thick from the silicon oxynitride film. After the second interlayer insulating film 5065 made of organic insulating materials is formed, contact holes are formed in the first interlayer insulating film 5064, the second interlayer insulating film 5065, and the gate insulting film 5007. After forming each wiring (including connection electrodes) 5066 to 5071 and 5073, by patterning, a pixel electrode 5072 contacting the connection electrode 5071 is formed by patterning.

An organic resin material is used for the second interlayer insulating film 5065. Organic resins such as polyimide, polyamide, acrylic, and BCB (benzocyclobutene) can be used. In particular, it is preferable to use acrylic, which has superior levelness for the second interlayer insulating film 5065, because it is formed with a strong implication of leveling. An acrylic film is formed in Embodiment 3 at a film thickness at which steps formed by the TFTs can be sufficiently leveled. The film thickness is preferably from 1 to 5 μm (more preferably between 2 and 4 μm).

Formation of the contact holes is done using dry etching or wet etching, and contact holes for reaching the n-type impurity regions 5017 to 5021 and 5023 to 5025 or the p-type impurity regions 5052 to 5063, a contact hole for reaching the wiring 5031, a contact hole for reaching the electric current supply line (not shown in the figure), and contact holes for reaching the gate electrodes (not shown in the figure) are formed.

Further, a three layer structure lamination film, in which a 100 nm thick Ti film, a 300 nm thick Al film containing Ti, and a 150 nm thick Ti film are formed in succession by sputtering and then patterned into a predetermined shape, is used for the wirings (a connecting wiring and a signal wiring are included) 5066 to 5071 and 5073. Of course, other conductive films may be used.

An indium oxide tin oxide (ITO) film is formed as the pixel electrode 5072 with a thickness of 110 nm in Embodiment 3, and patterning is then performed. The contact is attained such that the pixel electrode 5072 is arranged so as to contact and overlap with the connection electrode 5071. Further, a transparent conductive film in which between 2 and 20% zinc oxide (ZnO) is mixed with indium oxide may also be used. The pixel electrode 5072 becomes an anode of an EL element. (See FIG. 6A)

Next, as shown in FIG. 6B, an insulating film containing silicon (a silicon oxide film in Embodiment 3) is formed with a thickness of 500 nm, an open portion is formed in a location corresponding to the pixel electrode 5072, and a third interlayer insulating film 5074 is formed. Sidewalls can easily be formed into a tapered shape by using wet etching when forming the open portion. If the sidewalls of the open portion are not sufficiently gentle, then there is a conspicuous problem in which the EL layers degrade due to the step.

An EL layer 5075 and a cathode (MgAg electrode) 5076 are formed next in succession, without exposure to the atmosphere, using vacuum evaporation. Note that the film thickness of the EL layer 5075 may be set from 80 to 200 nm (typically between 100 and 120 nm), and the thickness of the cathode 5076 may be set from 180 to 300 nm (typically 200 to 250 nm).

The EL layer and the cathode are formed one after another with respect to pixels corresponding to the color red, pixels corresponding to the color green, and pixels corresponding to the color blue. However, the EL layer is weak with respect to a solution, and therefore each of the colors must be formed separately without using a photolithography technique. It is preferable to cover areas outside the desired pixels using a metal mask, and selectively form the EL layer and the cathode only in the necessary locations.

Namely, a mask is first set so as to cover all pixels other than ones corresponding to the color red, and a red color light emitting EL layer and a cathode are selectively formed using the mask. Next, a mask is set so as to cover all pixels other than ones corresponding to the color green, and a green color light emitting EL layer and a cathode are selectively formed. A mask is similarly set so as to cover all pixels other than ones corresponding to the color blue, and a blue color light emitting EL layer and a cathode are selectively formed. Note that although it is stated here that all differing masks are used, the same mask may also be reused. Further, it is preferable to perform processing up through the formation of the EL layers and the cathodes in all pixels without breaking the vacuum.

A method of forming three types of EL elements corresponding to each color RGB is used here, but methods such as a method of combining color filters and white color light emitting EL elements; a method of combining blue color or blue-green color light emitting EL elements and a fluorescing body (fluorescing color conversion layer, CCM), and a method of utilizing transparent electrodes in the cathodes (opposing electrodes) and overlapping EL elements corresponding to RGB may also be used.

Note that known materials may be used for the EL layer 5075. Organic materials may be preferably used as the known materials, taking a driver voltage into consideration. For example, a four layer structure of a hole injecting layer, a hole transporting layer, a light emitting layer, and an electron injecting layer may be used. Further, an example of using an MgAg electrode as the cathode of the EL element is shown in Embodiment 3, but it is also possible to use other known materials.

A protecting electrode 5077 is formed next, covering the EL layers and the cathodes. A conductive film having aluminum as its main constituent may be used as the protecting electrode 5077. The protecting electrode 5077 may be formed by vacuum evaporation using a different mask from that used in forming the EL layers and the cathodes. Further, it is preferable to form the protecting electrode after forming the EL layers and the cathodes, without exposure to the atmosphere.

Finally, a passivation film 5078 is formed of a silicon nitride film with a thickness of 300 nm. In practice, the protecting electrode 5088 fulfills a role of protecting the EL layers from contaminants such as moisture, and in addition, the reliability of the EL elements can be additionally increased by forming the passivation film 5078.

An active matrix electronic device having a structure like that shown in FIG. 6B is thus completed. Note that, in the manufacturing processes for the active matrix electronic device in Embodiment 3, the source signal lines are formed by Ta and W, materials used to form the gate electrodes, due to the circuit structure and processing considerations. In addition, the gate signal lines are formed by Al, the wiring material used in forming the source and drain electrodes. However, different materials may also be used.

In the active matrix substrate of Embodiment 3 an extremely high reliability is thus shown, and the operating characteristics are also improved not only in the pixel portion, but also in the driver circuit portion by arranging TFTs having suitable structures. It is also possible to add a metallic catalyst such as Ni in the crystallization step, thereby increasing crystallinity. It therefore becomes possible to set the driving frequency of the source signal line driver circuit to 10 MHz or higher.

First, a TFT having a structure in which hot carrier injection is reduced without even a small drop in the operating speed is used as an n-channel TFT of a CMOS circuit forming the driver circuit portion. Note that the driver circuit referred to here includes circuits such as a shift register, a buffer, a level shifter, a latch in line-sequential drive, and a transmission gate in dot-sequential drive.

In Embodiment 3, the active layer of the n-channel TFT contains a source region, a drain region, a GOLD region, an LDD region, and a channel forming region, and the GOLD region overlaps with the gate electrode through the gate insulating film.

Further, there is not much need to worry about degradation due to hot carrier injection with the p-channel TFT of the CMOS circuit, and therefore LDD regions need not be formed in particular. It is of course possible to form an LDD region similar to that of the n-charnel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. A circuit such as a transmission gate used in dot-sequential drive can be given as such an example. Further, when a CMOS circuit in which it is necessary to suppress the value of the off current as much as possible is used, the n-channel TFT forming the CMOS circuit preferably has a structure in which a portion of the LDD region overlaps with the gate electrode through the gate insulating film. A circuit such as the transmission gate used in dot-sequential drive can be given as such an example.

Note that, in practice, it is preferable to perform packaging (sealing), without exposure to the atmosphere, using a protective film (such as a laminated film or an ultraviolet hardened resin film) having good airtight characteristics and little outgassing, and a transparent sealing material, after completing through the state of FIG. 6B. At this time, the reliability of the EL element is increased by making an inert atmosphere on the inside of the sealing material and by arranging a drying agent (barium oxide, for example) inside the sealing material.

Furthermore, after the airtight properties have been increased in accordance with the packaging process, a connector (flexible printed circuit, FPC) is attached in order to connect terminals drawn from the elements and circuits formed on the substrate with external signal terminals. And a finished product is completed. The device in this state at which it is ready for delivery as the product is referred to as an electronic device throughout this specification.

Furthermore, in accordance with the processes shown in Embodiment 3, the active matrix substrate can be manufactured by using five photomasks (an island shape semiconductor layer pattern, a first wiring pattern (gate wiring, island-like source wiring, capacitor wirings), an n-channel region mask pattern, a contact hole pattern, and a second wiring pattern (including pixel electrodes and connection electrodes). As a result, the processes can be reduced, and this contributes to a reduction in the manufacturing costs and an increase in throughput.

Embodiment 4

An example of manufacturing an electronic device using the present invention is explained in embodiment 4

Figure 7A:
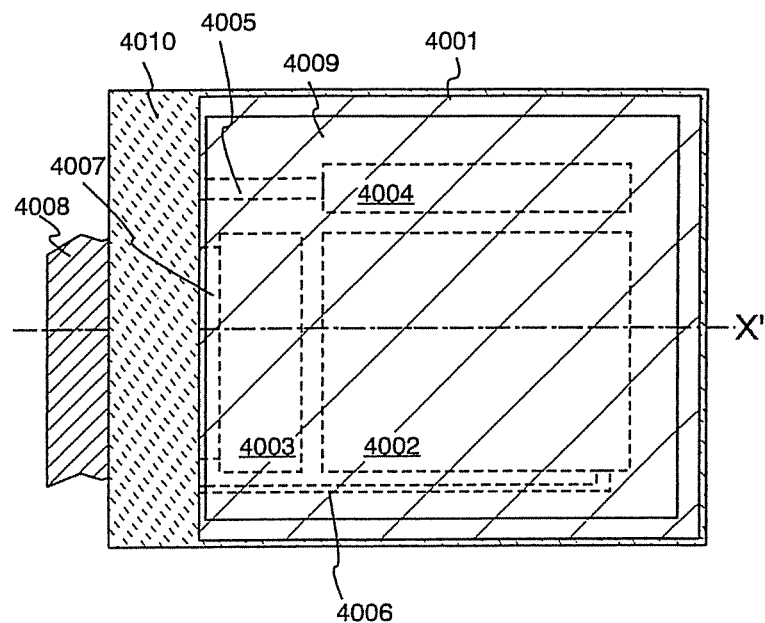
FIGS. 7A and 7B show an electronic device according to Embodiment 4, where
Figure 7B:
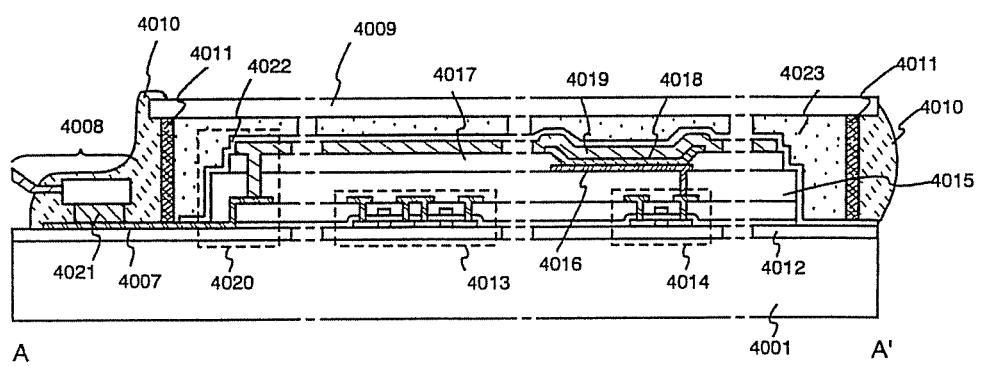

FIG. 7A is a top view of an electronic device using the present invention. FIG. 7B is a cross sectional view taken along the line X-X' of FIG. 7A. In FIG. 7A, reference numeral 4001 is a substrate, reference numeral 4002 is a pixel portion, reference numeral 4003 is a source signal side driver circuit, and reference numeral 4004 is a gate signal side driver circuit. The driver circuits are connected to external equipment, through an FPC 4008, via wirings 4005, 4006 and 4007.

A covering material 4009, an airtight sealing material 4010 and a sealing material (also referred to as a housing material shown in FIG. 7B) 4011 are formed so as to enclose at least the pixel portion, preferably the driver circuits and the pixel portion, at this point.

Further, FIG. 7B is a cross sectional structure of the electronic device of the present invention. A driver circuit TFT 4013 (note that a CMOS circuit in which an n-channel TFT and a p-channel TFT are combined is shown in the figure here), a pixel portion TFT 4014 (note that only an EL driver TFT for controlling the current flowing to an EL element is shown here) are formed on a base film 4012 on a substrate 4001. The TFTs may be formed using a known structure (a top gate structure or a bottom gate structure).

After the driver circuit TFT 4013 and the pixel portion TFT 4014 are completed, a pixel electrode 4016 is formed on an interlayer insulating film (leveling film) 4015 made from a resin material. The pixel electrode is formed from a transparent conducting film for electrically connecting to a drain of the pixel TFT 4014. An indium oxide and tin oxide compound (referred to as ITO) or an indium oxide and zinc oxide compound can be used as the transparent conducting film. An insulating film 4017 is formed after forming the pixel electrode 4016, and an open portion is formed on the pixel electrode 4016.

An EL layer 4018 is formed next. The EL layer 4018 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In embodiment 4, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the electronic device can also be made to emit a single color of light.

After forming the EL layer 4018, a cathode 4019 is formed on the EL layer. It is preferable to remove as much as possible any moisture or oxygen existing in the interface between the cathode 4019 and the EL layer 4018. It is therefore necessary to use a method of depositing the EL layer 4018 and the cathode 4019 in an inert gas atmosphere or within a vacuum. The above film deposition becomes possible in embodiment 4 by using a multi-chamber method (cluster tool method) film deposition apparatus.

Note that a lamination structure of a LiF (lithium fluoride) film and an Al (aluminum) film is used in embodiment 4 as the cathode 4019. Specifically, a 1 nm thick LiF (lithium fluoride) film is formed by evaporation on the EL layer 4018, and a 300 nm thick aluminum film is formed on the LiF film. An MgAg electrode, a known cathode material, may of course also be used. The wiring 4007 is then connected to the cathode 4019 in a region denoted by reference numeral 4020. The wiring 4007 is an electric power supply line for imparting a predetermined voltage to the cathode 4019, and is connected to the FPC 4008 through a conducting paste material 4021.

In order to electrically connect the cathode 4019 and the wiring 4007 in the region denoted by reference numeral 4020, it is necessary to form a contact hole in the interlayer insulating film 4015 and the insulating film 4017. The contact holes may be formed at the time of etching the interlayer insulating film 4015 (when forming a contact hole for the pixel electrode) and at the time of etching the insulating film 4017 (when forming the opening portion before forming the EL layer). Further, when etching the insulating film 4017, etching may be performed all the way to the interlayer insulating film 4015 at one time. A good contact hole can be formed in this case, provided that the interlayer insulating film 4015 and the insulating film 4017 are the same resin material.

A passivation film 4022, a filling material 4023, and the covering material 4009 are formed covering the surface of the EL element thus made.

In addition, the sealing material 4011 is formed between the covering material 4009 and the substrate 4001, so as to surround the EL element portion, and the airtight sealing material (the second sealing material) 4010 is formed on the outside of the sealing material 4011.

The filling material 4023 functions as an adhesive for bonding the covering material 4009 at this point. PVC (polyvinyl chloride), epoxy resin, silicone resin, PVB (polyvinyl butyral), and EVA (ethylene vinyl acetate) can be used as the filling material 4023. If a drying agent is formed on the inside of the filling material 4023, then it can continue to maintain a moisture absorbing effect, which is preferable. Further, deterioration of the EL layer may be suppressed by arranging a material such as an oxidation preventing agent having an oxygen capturing effect inside the filler material 4023.

Further, spacers may be contained within the filling material 4023. The spacers may be a powdered substance such as BaO, giving the spacers themselves the ability to absorb moisture.

When using spacers, the passivation film 4022 can relieve the spacer pressure. Further, a film such as a resin film can be formed separately from the passivation film 4022 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 4009. Note that if PVB or EVA is used as the filling material 4023, it is preferable to use a sheet with a structure in which several tens of µm aluminum foil is sandwiched by a PVF film or a Mylar film.

However, depending upon the light emission direction from the EL element (the light radiation direction), it is necessary for the covering material 4009 to have light transmitting characteristics.

Further, the wiring 4007 is electrically connected to the FPC 4008 through a gap between the sealing material 4011 and the substrate 4001. Note that although an explanation of the wiring 4007 has been made here, the wirings 4005 and 4006 are also electrically connected to the FPC 4008 by similarly passing underneath the sealing material 4011 and sealing material 4010.

In this embodiment, the covering material 4009 is bonded after forming the filling material 4023, and the sealing material 4011 is attached so as to cover the lateral surfaces (exposed surfaces) of the filling material 4023, but the filling material 4023 may also be formed after attaching the covering material 4009 and the sealing material 4011. In this case, a filling material injection opening is formed through a gap formed by the substrate 4001, the covering material 4009, and the sealing material 4011. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Embodiment 5

Figure 8:
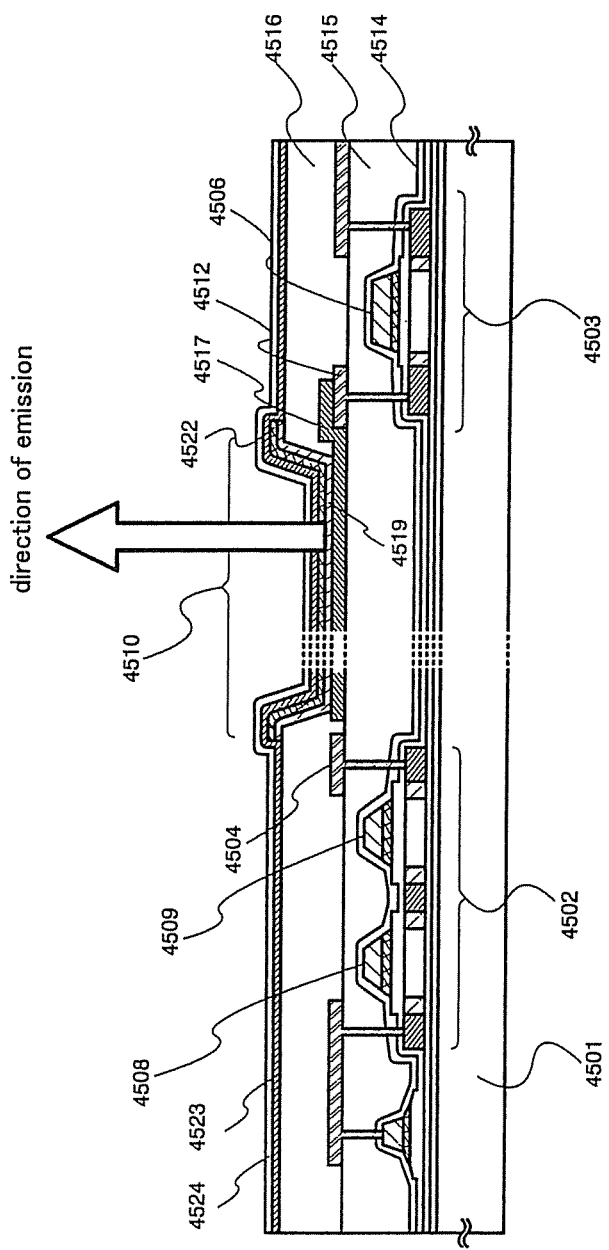
FIG. 8 is a sectional view showing a pixel portion of an electronic device according to Embodiment 5.

A more detailed cross sectional structure of a pixel portion of the electronic device is shown here in FIG. 8.

A switching TFT 4502 formed on a substrate 4501 is manufactured by using a n-channel type TFT. A double gate structure is used in embodiment 4. In this embodiment, although a double gate structure is used, since there is no big difference in the structure and fabricating process, explanation is omitted. However, a structure in which two TFTs are substantially connected in series with each other is obtained by adopting the double gate structure, and there is a merit that an off current value can be decreased. Further although the double gate structure is used in this embodiment, a single gate structure, a triple gate structure, and a multi gate structure possessing a greater number of gates may also be used.

Further, an EL driving TFT 4503 is formed by using an n-channel TFT. A drain wiring 4504 of the switching TFT 4502 is electrically connected to a gate electrode 4506 of the EL driving TFT 4503 through a wiring (not shown in figure).

In a case where a driving voltage of the electronic device is high (10V or more), a driver circuit TFT, in particular an N-channel type TFT, has high fear of deterioration due to hot carriers or the like. Thus, it is very effective to adopt a structure in which an LDD region (GOLD region) is provided at a drain side of the N-channel type TFT, or at source and drain sides so as to overlap with a gate electrode through a gate insulating film, as shown in FIG. 6B of Embodiment 3. In a case where a driving voltage is low (10V or less), there is no fear of deterioration due to hot carrier. Thus, as shown in FIG. 8 of Embodiment 6, there is no need to provide a GOLD region. However, with respect to the switching TFT 4502 in a pixel portion, it is very effective to adopt a structure in which an LDD region is provided at a drain side of the N-channel type TFT, or at source and drain sides so as not to overlap with a gate electrode through a gate insulating film to reduce an off-current. At this time, with respect to the EL driving TFT 4503, there is no need to provide an LDD region, however, a private (dedicated) mask is necessary to cover the portion of the EL driving TFT 4503 with a resist when an LDD region is formed in the switching TFT 4502. Therefore, in Embodiment 6, the EL driving TFT 4503 is formed with the same structure (the structure having an LDD region) as that of the switching TFT 4502 to reduce the mask number.

The manufacturing processes of TFTs having a structure shown in Embodiment 6 will be described herein with reference to FIG. 9.

Figure 9A:
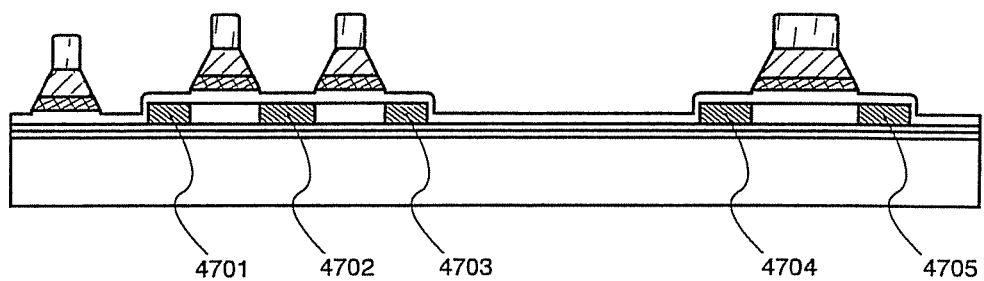
FIGS. 9A and 9B are diagrams showing an example of a process of manufacturing the electronic device according to Embodiment 5.
Figure 9B:
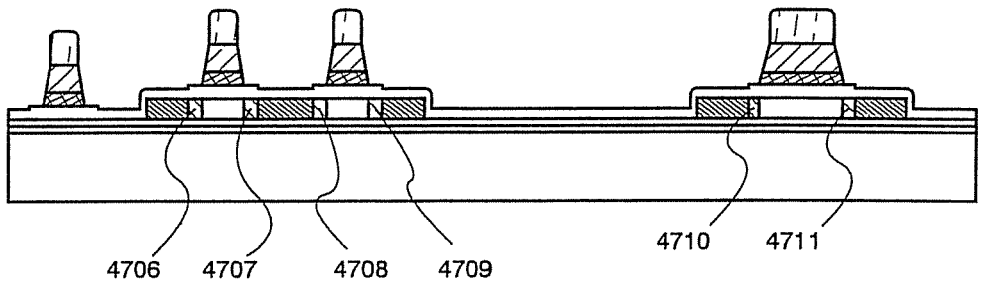

FIG. 9A shows a state which is obtained after the processes illustrated in FIG. 4B are completed in accordance with Embodiment 3. By employing up to the processes, first impurity regions 4701 to 4705 are formed. Subsequently, a first conductive film made of a Ta film and a second conductive film made of a W film are etched as shown in FIG. 9B, and second impurity regions 4706 to 4711 having lower concentration than that of the first impurity regions are formed inside the first impurity regions formed in an island-like semiconductor layer in FIG. 9A. Thus formed second impurity regions 4706 to 4711 will be the above mentioned LDD region.

In accordance with Embodiment 3, again, an active matrix substrate may be completed by employing processes shown after FIG. 5B.

In this embodiment, although the EL driving TFT 4503 is shown as a single gate structure, a multi-gate structure in which a plurality of TFTs are connected in series with each other may be adopted. Further, such a structure may be adopted that a plurality of TFTs are connected in parallel with each other to substantially divide a channel forming region into plural portions, so that radiation of heat can be made at high efficiency. Such structure is effective as a countermeasure against deterioration due to heat.

Further, the wiring (not shown in figure) including the gate electrode 4506 of the EL driving TFT 4503 partly overlaps with a drain wiring 4512 of the EL driving TFT 4503 through an insulating film, and a storage capacitor is formed in the region. The storage capacitor functions to store a voltage applied to the gate electrode 4506 of the EL driving TFT 4503.

A first interlayer insulating film 4514 is provided on the switching TFT 4502 and the EL driving TFT 4503, and a second interlayer insulating film 4515 made of a resin insulating film is formed thereon.

Furthermore, reference numeral 4517 denotes a pixel electrode (EL element cathode) made from a conducting film with high reflectivity, and this is electrically connected to a drain region of the EL driver TFT 4503. It is preferable to use a low resistance conducting film, such as an aluminum alloy film, a copper alloy film, and a silver alloy film, or a laminate of such films. Of course, a lamination structure with another conducting film may also be used.

Next, the organic resin film 4516 is formed in the pixel electrode 4517 and the EL layer 4519 is formed after patterning is performed on the facing portion of the pixel electrode 4517. Although not shown in the figures here, but the light emitting layer may be divided to correspond to each of the colors R (red), G (green), and B (blue). A conjugate polymer material is used as an organic EL material. Polyparaphenylene vinylenes (PPVs), polyvinyl carbazoles (PVKs), and polyfluoranes can be given as typical polymer materials.

Note that there are several types of PPV organic EL materials, and materials recorded in Schenk, H., Becker, H., Gelsen, O., Kluge, E., Kreuder, W., and Spreitzer, H., Polymers for Light Emitting Diodes, Euro Display Proceedings, 1999, pp. 33-7, and in Japanese Patent Application Laid-open No. Hei 10-92576, for example, may be used.

As specific light emitting layers, cyano-polyphenylene vinylene may be used as a red light radiating luminescence layer, polyphenylene vinylene may be used as a green light radiating luminescence layer, and polyphenylene vinylene or polyalkylphenylene may be used as a blue light radiating luminescence layer. The film thicknesses may be between 30 and 150 nm (preferably between 40 and 100 nm).

However, the above example is one example of the organic EL materials which can be used as luminescence layers, and it is not necessary to limit use to these materials. An EL layer (a layer for emitting light and for performing carrier motion for such) may be formed by freely combining light emitting layers, electric charge transporting layers, and electric charge injecting layers.

For example, Embodiment 5 shows an example of using a polymer material as a light emitting layer, but a low molecular weight organic EL material may also be used. Further, it is possible to use inorganic materials such as silicon carbide, as an electric charge transporting layer or an electric charge injecting layer. Known materials can be used for these organic EL materials and inorganic materials.

An EL element 4510 is complete at the point where the anode 4523 is formed. Note that what is called the EL element 4510 indicates the pixel electrode (cathode) 4517 and the retention capacitor formed by the light emitting layer 4519, hole injecting layer 4522 and the anode 4523.

In addition, a passivation film 4524 is then formed on the anode 4523 in Embodiment 5. It is preferable to use a silicon nitride film or an oxidized silicon nitride film as the passivation film 4524. The purpose of this is the isolation of the EL element from the outside, and this is meaningful in preventing degradation due to oxidation of the organic EL material, and in controlling gaseous emitted from the organic EL material. The reliability of the electronic device can thus be raised.

The EL display panel of Embodiment 5 has a pixel portion made from pixels structured as in FIG. 8, and has a switching TFT with a sufficiently low off current value, and a EL driving TFT which is strong with respect to hot carrier injection. An electronic device having high reliability, and in which good image display is possible, can therefore be obtained.

In the case that the EL element having the structure explained in this embodiment, the light emitted from the light emitting layer 4519 is radiated to reverse direction of substrate formed TFT on it as shown by an arrow.

Embodiment 6

Figure 10:
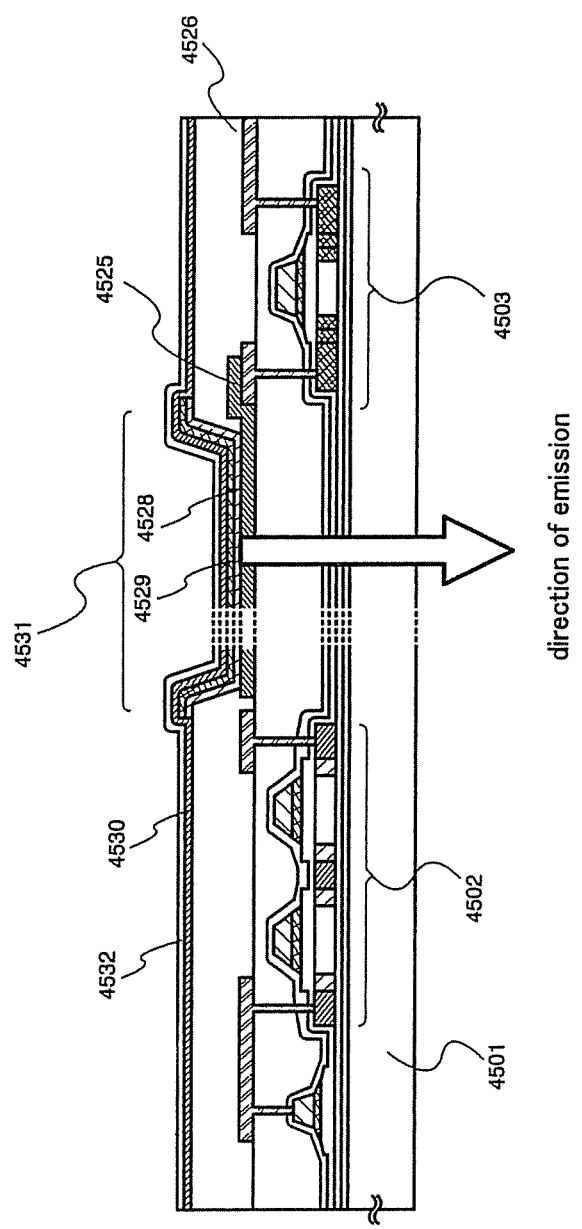
FIG. 10 is a sectional view showing a pixel portion of an electronic device according to Embodiment 6.

In this embodiment, the structure of the EL element 4510 which is reversed in a pixel portion shown in FIG. 8 of Embodiment 5 will be described. FIG. 10 will be referred for the explanation. Note that the different point of the structure illustrated in FIG. 8 is only an EL element portion and a TFT portion, so that the rest will not be explained.

In FIG. 10, as the switching TFT 4502, a n-channel TFT formed in accordance with a known method will be used. As the EL driving TFT 4503, a p-channel TFT formed in accordance with a known method is used. It is desirable to use the switching TFT and the EL driving TFT having the same polarity.

In Embodiment 6, a transparent conductive film is used as the pixel electrode (anode) 4525. Specifically, a conductive film made of a compound of indium oxide and zinc oxide is used. Of course, a conductive film made of a compound of indium oxide and tin oxide.

Then, a third interlayer insulating film 4526 made of a resin film is formed, a light-emitting layer 4528 is formed. On the light-emitting layer 4528, an electron injection layer 4529 made of potassium acetyl acetonate (acacK), and a cathode 4530 made of an aluminum alloy are formed.

Subsequently, in the same way as in Embodiment 5, a passivation film 4532 is formed to prevent oxidation of an organic EL material, thereby forming an EL element 4531.

In the case of an EL element having the structure described in Embodiment 6, light generated in the light emitting layer 4528 is radiated to the substrate on which TFTs are formed as indicated by an arrow.

Embodiment 7

In order to carry out the driving method of the present invention, the pixel portion needs to have the storage capacitor line 1711 as shown in FIGS. 17A and 17B. The pixel portion structured as such has a large number of wirings and hence is inferior in terms of aperture ratio to a pixel portion in which one terminal of the storage capacitor 1604 is connected to the current supply line 1607 as shown in FIGS. 16A and 16B. Accordingly, Embodiment 7 describes a case in which the driving method of the present invention is carried out with a pixel portion whose wirings are reduced in number by using the gate signal line also as the current supply line. The pixel of this embodiment in which the gate signal line also serves as the current signal line is disclosed in Japanese Patent Application No. 2000-087683.

Figure 11A:
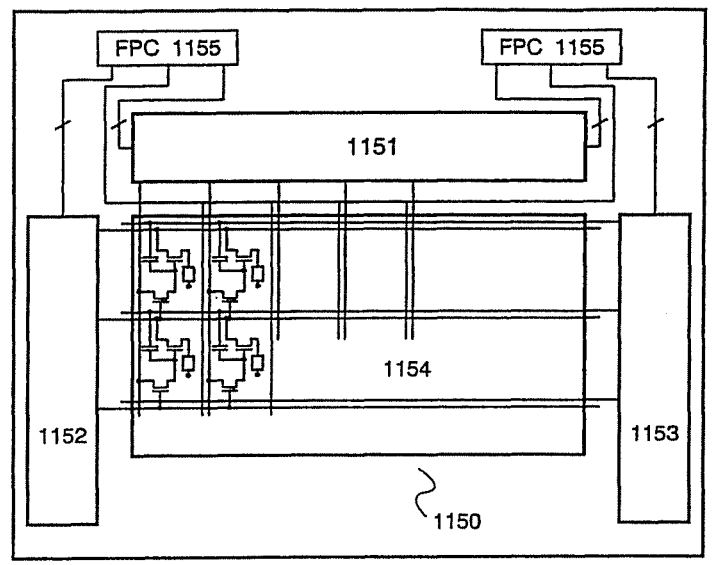
FIGS. 11A and 11B are diagrams showing an example of circuit structure of an electronic device according to Embodiment 7.
Figure 11B:
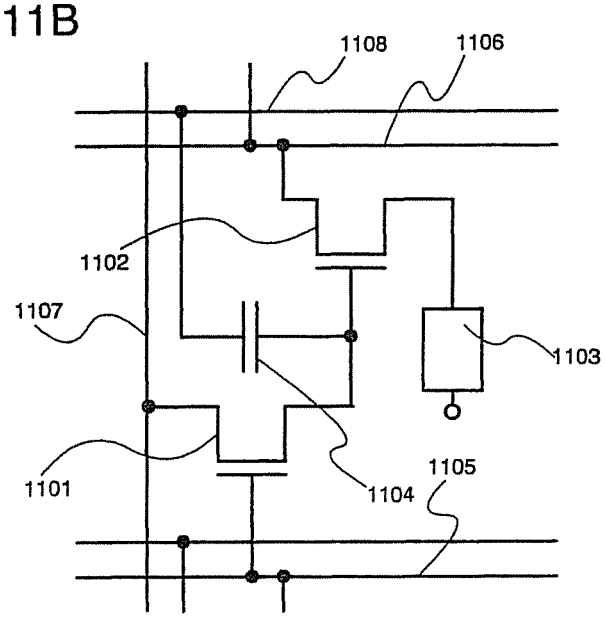

Reference is made to FIGS. 11A and 11B. FIGS. 11A and 11B show an example of the circuit structure for carrying out the driving method of the present invention by using the pixel in which the gate signal line also serves as the current supply line. A pixel portion 1154 is placed in the center of a substrate 1150. A source signal line side driver circuit 1151 is arranged above the pixel portion 1154. A gate signal line side driver circuit 1152 is put to the left of the pixel portion 1154. A storage capacitor line driving circuit 1153 is set to the right of the pixel portion. FIG. 11B is a circuit diagram showing one pixel. In FIG. 11B, reference symbol 1101 denotes a switching TFT, 1102, an EL driving TFT, 1103, an EL element, 1104, a storage capacitor, 1105, a gate signal line, 1106, a gate signal line one row prior to the gate signal line 1105, 1107, a source signal line, and 1108, a storage capacitor line.

The structural feature of this pixel resides in that one of a source region and a drain region of the EL driving TFT 1102 is connected to the precedent row gate signal line 1106. In FIG. 11B, if the gate signal line 1106 is scanned (k−1)-th and the gate signal line 1105 is scanned k-th, the (k−1)-th row gate signal line 1106 is scanned first and, after the scan is completed, scanning of the k-th row gate signal line 1105 is started immediately. During the k-th row gate signal line 1105 is scanned, the electric potential of the (k−1)-th row gate signal line 1106 that has already been scanned is kept constant. Paying attention to this fact leads to an arrangement in which supply of current to the EL element 1103 controlled by the k-th row gate signal line 1105 is made by utilizing the (k−1)-th row gate signal line 1106.

The polarity of the EL driving TFT 1102 may either be of p-channel or n-channel. However, as mentioned before, a p-channel TFT is desirable taking into consideration proper source grounding and structural restrictions on the EL element. The case described in this embodiment uses a p-channel TFT for the EL driving TFT 1102.

Also note that the switching TFT 1101 in this case has to have the same polarity as the EL driving TFT 1102 from a reason to be revealed later.

Figure 12:
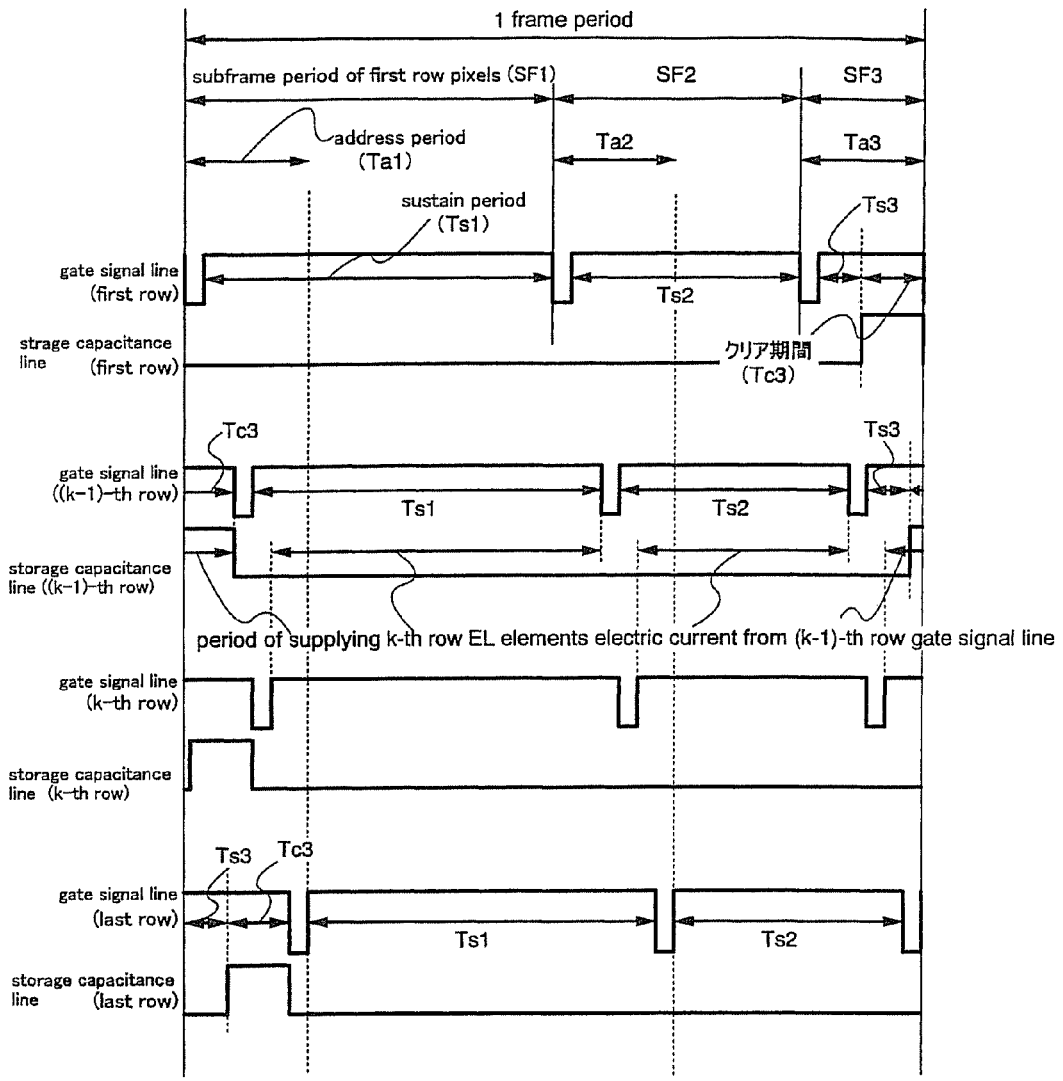
FIG. 12 is a timing chart illustrating a driving method according to Embodiment 7 of the present invention.
Figure 13:
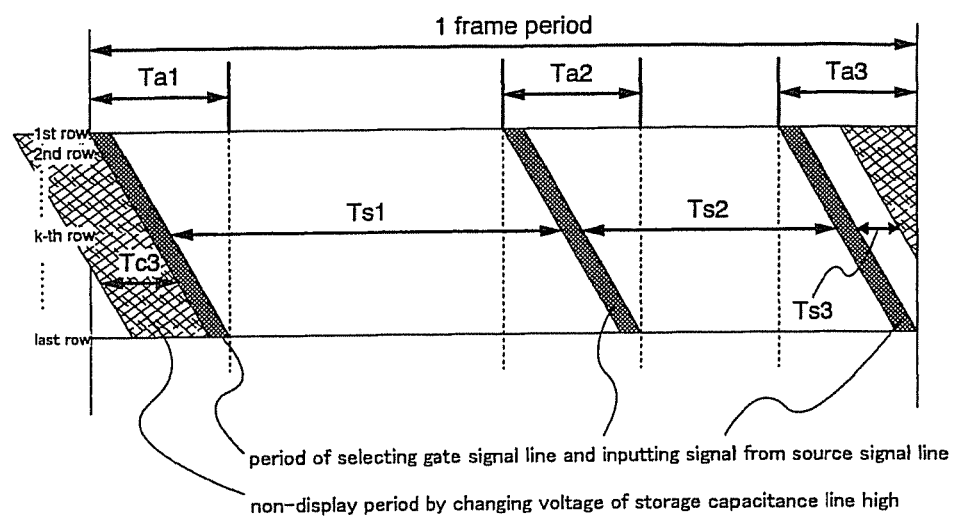
FIG. 13 is a timing chart illustrating the driving method according to Embodiment 7 of the present invention.
Figure 14A:
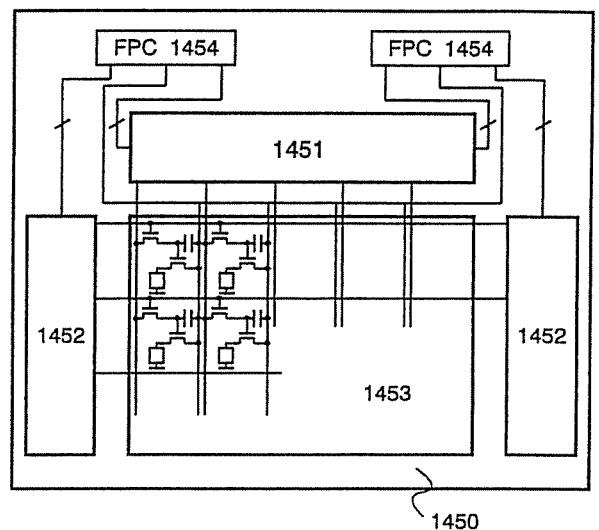
FIGS. 14A and 14B are diagrams showing an example of circuit structure of an electronic device.
Figure 14B:
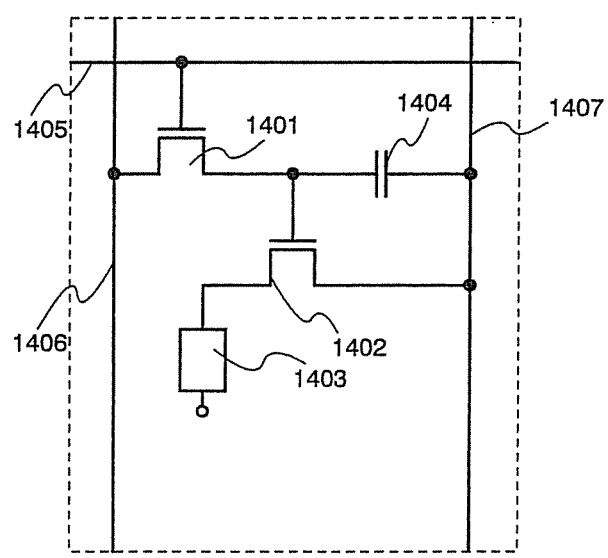
Figure 15A:
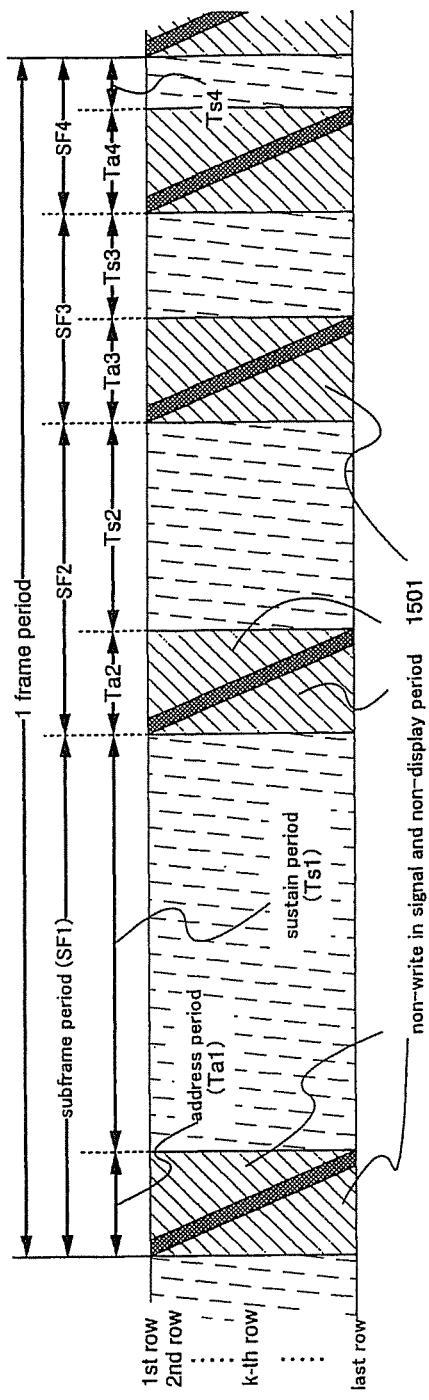
FIGS. 15A and 15B are timing charts illustrating division of a frame period in time gray scale.
Figure 15B:
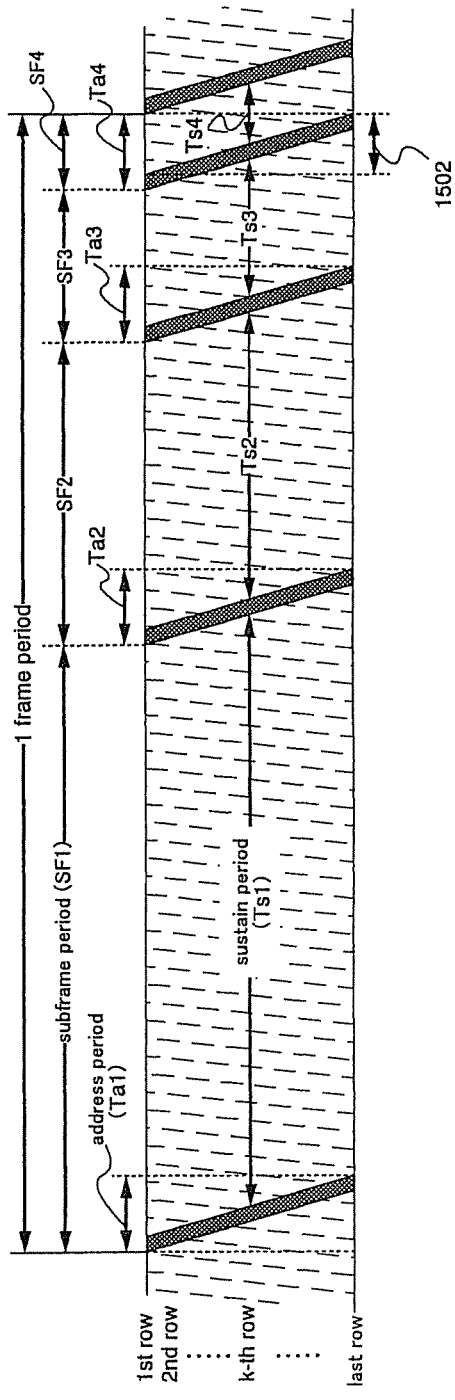

The actual driving will be described below. FIGS. 12 and 13 show timing charts. The illustrated example is of 3 bit gray scale display, and a sustain (lights-on) period $Ts_3$ is shorter than an address (writing) period. The circuit of this embodiment is different from the circuit of Embodiment 1 in structure of the pixel portion. However, the same driving as Embodiment 1 is possible in this embodiment and a clear period is provided by increasing the electric potential of the storage capacitor line 1108 in order to avoid overlap of address (writing) periods. The electric potential of the (k−1)-th row gate signal line 1106 is kept constant after the gate signal line 1106 is no longer selected. Until selected next time, the gate signal line 1106 supplies a current to the EL element 1103 controlled by the k-th row gate signal line 1105.

The aforementioned reason relating to the polarity of the TFTs will now be discussed. According to the foregoing description, the switching TFT 1101 and the EL driving TFT 1102 have to have the same polarity. This means that, since a p-channel TFT is used for the EL driving TFT 1102, the switching TFT 1101 also has to be a p-channel TFT in this embodiment. Assume a case in which the switching TFT 1101 is an n-channel TFT despite the EL driving TFT being a p-channel TFT. In order to turn the n-channel switching TFT 1101 conductive, a signal inputted to a gate electrode of the switching TFT 1101 has to be a Hi signal. In other words, the gate signal lines 1105 and 1106 are given Hi electric potentials when they are selected whereas they are given LO electric potentials when they are not selected. With the EL driving TFT 1102 being a p-channel TFT, in order to supply a current to the EL element 1103, the electric potential has to be higher on the source side of the EL driving TFT 1102 than in an anode 1110 of the EL element. That is, the electric potential of the gate signal line 1106 has to be higher. When the switching TFT 1101 is an n-channel TFT as in the above assumption, the electric potential of the gate signal line which is set so as to fit to drive the n-channel TFT turns into a LO electric potential during the gate signal line is not selected, so that a current cannot be supplied to the EL element 1103. Therefore, the switching TFT has to be a p-channel TFT if the EL driving TFT 1102 is a p-channel TFT.

According to the circuit structure of this embodiment, a current is supplied, through a connection with the (k−1)-th row gate signal line 1106, to the EL element 1103 controlled by the k-th row gate signal line 1105. However, a gate signal line other than the line 1106 can provide the same driving as long as it is not selected at that time. Considering dulling of a signal waveform of the gate signal line, a current is supplied to the EL element desirably by a gate signal two or more rows ahead or behind the line 1105, rather than its adjacent gate signal lines. On the other hand, the aperture ratio is decreased as the number of the connection wirings is increased. Therefore, an operator should find the optimum arrangement taking into consideration the circuit structure, the characteristics of the TFT elements, etc.

Embodiment 8

Figure 21A:
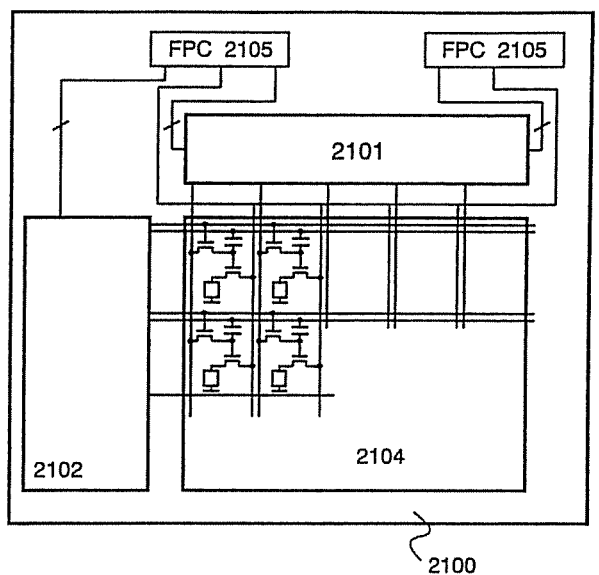
FIGS. 21A and 21B are diagrams showing an example of circuit structure of an electronic device according to Embodiment 8.
Figure 21B:
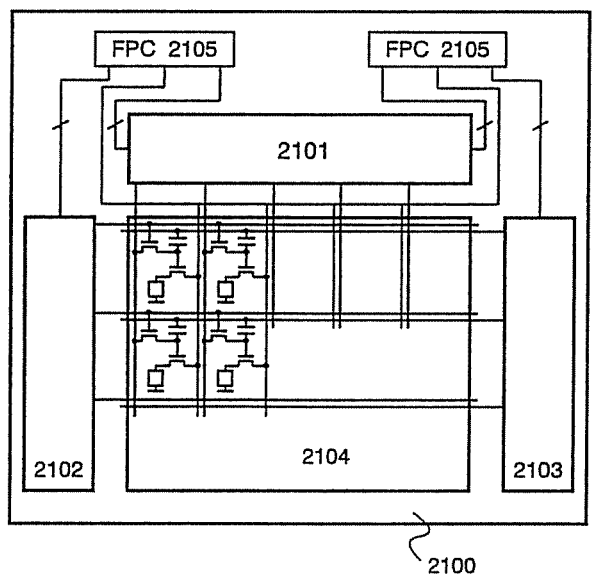

The storage capacitor line driving circuit of the present invention which controls the electric potential of the storage capacitor line is an independent circuit in the case shown in Embodiment 1. However, it may be unified as shown in FIG. 21A. A desirable arrangement for the gate signal line side driver circuit in terms of driving is to place one on each side of the pixel portion. As shown in FIG. 21B, the gate signal line side driver circuit and the storage capacitor line driving circuit may be integrated into one circuit to be placed on each side of the pixel portion.

Embodiment 9

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K Honda, (Elsevier Sci. Pub., Tokyo, 1991) p. 437).

The molecular formula of an EL material (coumarin pigment) reported by the above article is represented as follows.
(Chemical Formula 1)
(M. A. Baldo, D. F. O Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.
(Chemical Formula 2)
(M. A. Baldo, S. Lamansky, P. E. Burrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.
(Chemical Formula 3)

As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the first to eighth embodiments.

Embodiment 10

The EL display device, which is an application of driving method of electronic device of the present invention, is a self light emitting type, therefore compared to a liquid crystal display device, it has excellent visible properties and is broad in an angle of visibility. Accordingly, the EL display device can be applied to a display portion in various electronic devices. For example, in order to view a TV program or the like on a large-sized screen, the EL display device in accordance with the present invention can be used as a display portion of an EL display having a diagonal size of 30 inches or larger (typically 40 inches or larger).

The EL display includes all kinds of displays to be used for displaying information, such as a display for a personal computer, a display for receiving a TV broadcasting program, a display for advertisement display. Moreover, the driving method of electronic equipments in accordance with the present invention can be used as a display portion of other various electric devices.

As other electronic equipments of the present invention there are: a video camera; a digital camera; a goggle type display (head mounted display); a navigation system; a sound reproduction device (a car audio stereo, an audio set and so forth): a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk Player (DVD), and displays the images). In particular, in the case of the portable information terminal, use of the EL display device is preferable, since the portable information terminal that is likely to be viewed from a tilted direction is often required to have a wide viewing angle. FIGS. 22A to 23B respectively show various specific examples of such electronic devices.

Figure 22A:
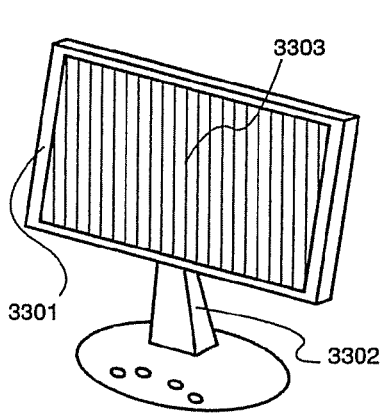
FIGS. 22A to 22F are diagrams showing examples of an electronic machine of Embodiment 10, to which a method of driving an electronic device according to the present invention is applied.

FIG. 22A shows an EL display containing a casing 3301, a support stand 3302, and a display portion 3303. The light emitting device of the present invention can be used as the display portion 3303. Such an EL display is a self light emitting type so that a back light is not necessary. Thus, the display portion can be made thinner than that of a liquid crystal display.

Figure 22B:
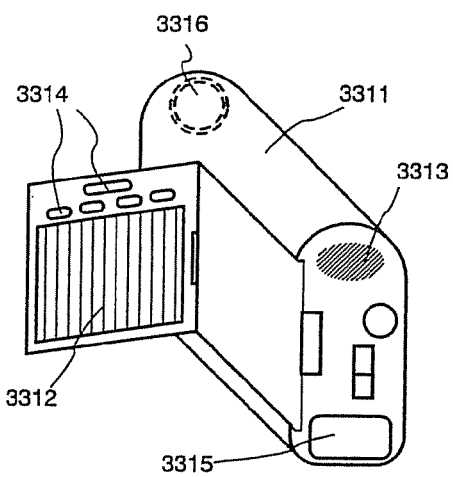

FIG. 22B shows a video camera, and contains a main body 3311, a display portion 3312, a sound input portion 3313, operation switches 3314, a battery 3315, and an image receiving portion 3316. The electronic device and the driving method of the present invention can be used as the display portion 3312.

Figure 22C:
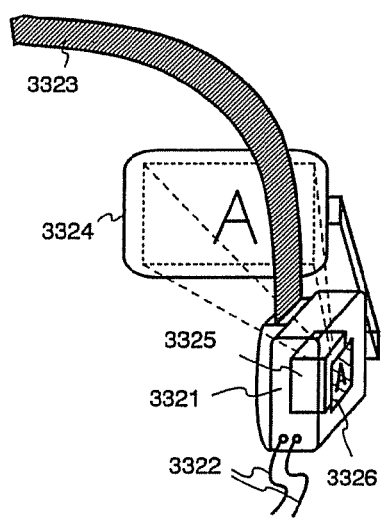

FIG. 22C shows a portion (the right-half piece) of an EL display of head mount type, which includes a main body 3321, signal cables 3322, a head mount band 3323, a display portion 3324, an optical system 3325, an display device 3326, or the like. The electronic device and the driving method of the present invention is applicable to the display device 3326.

Figure 22D:
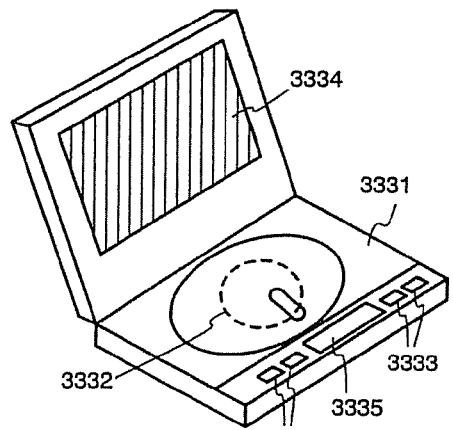

FIG. 22D shows an image playback device equipped with a recording medium (specifically, a DVD playback device), and contains a main body 3331, a recording medium (such as a DVD) 3332, operation switches 3333, a display portion (a) 3334, and a display portion (b) 3335. The display portion (a) 3334 is mainly used for displaying image information. The display portion (b) 3335 is mainly used for displaying character information. The light emitting device of the present invention can be used as the display portion (a) 3334 and as the display portion (b) 3335. Note that the image playback device equipped with the recording medium includes devices such as image playback devices and game machines.

Figure 22E:
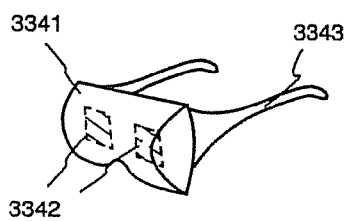

FIG. 22E shows a goggle type display device (head mount display device), which includes a main body 3341, a display portion 3342 and an arm portion 3343. The electronic device and the driving method of the present invention is applicable to the display portion 3342.

Figure 22F:
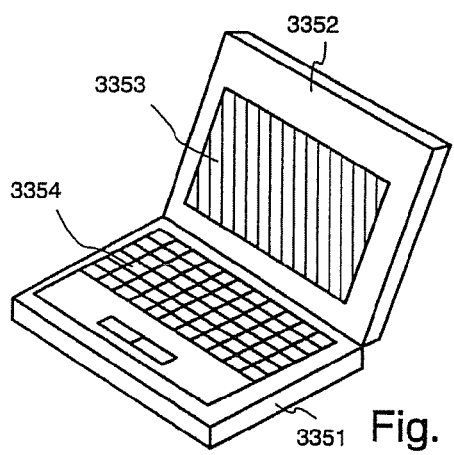

FIG. 22F is a personal computer, and contains a main body 3351, a casing 3352, a display portion 3353, and a keyboard 3354. The electronic device and the driving method of the present invention is applicable to the display portion 3353.

Note that if the luminance of EL material increases in the future, then it will become possible to use the light emitting device of the present invention in a front type or a rear type projector by expanding and projecting light containing output image information with a lens or the like.

Further, the above electric devices display often information transmitted through an electronic communication circuit such as the Internet and CATV (cable television), and particularly situations of displaying moving images is increasing. The response speed of EL materials is so high that the EL devices are good for display of moving image.

In addition, since the light emitting device conserves power in the light emitting portion, it is preferable to display information so as to make the light emitting portion as small as possible. Consequently, when using the EL display device in a display portion mainly for character information, such as in a portable information terminal, in particular a portable telephone or a sound reproduction device, it is preferable to drive the light emitting device so as to form character information by the light emitting portions while non-light emitting portions are set as background.

Figure 23A:
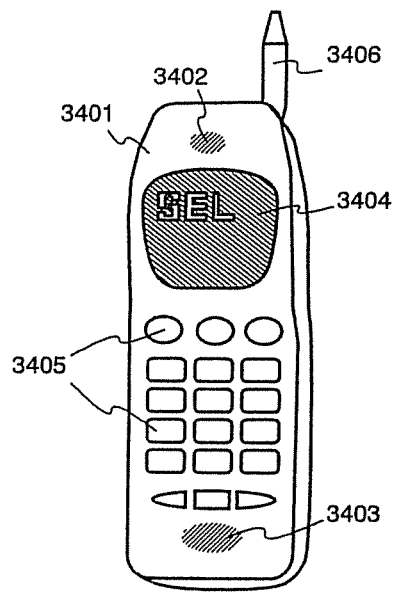
FIGS. 23A and 23B are diagrams showing examples of the electronic machine of Embodiment 10, to which a method of driving an electronic device according to the present invention is applied.

FIG. 23A shows a portable telephone, and contains a main body 3401, a sound output portion 3402, a sound input portion 3403, a display portion 3404, operation switches 3405, and an antenna 3406. The light emitting device of the present invention can be used as the display portion 3404. Note that by displaying white color characters in a black color background, the display portion 3404 can suppress the power consumption of the portable telephone.

Figure 23B:
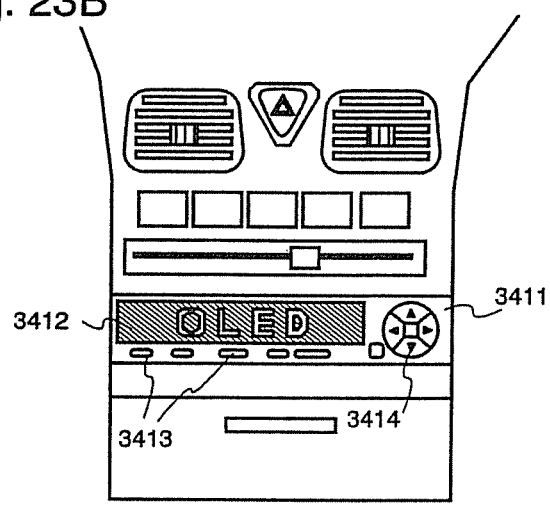

FIG. 23B shows a sound reproduction device, a car audio equipment in a concrete term, and contains a main body 3411, a display portion 3412, and operation switches 3413 and 3414. The light emitting device of the present invention can be used as the display portion 3412. Further, a car mounting audio stereo is shown in this embodiment, but a fixed type audio playback device may also be used. Note that, by displaying white color characters in a black color background, the display portion 3414 can suppress the power consumption.

As described above, the application range of this invention is extremely wide, and it may be used for electric devices in various fields. Further, the electric device of this embodiment may be obtained by using a light emitting device freely combining the structures of the first to ninth embodiments.

Effects of the present invention will be listed. Firstly, according to the present invention, pixels of another row can be brought into non-display state even when signals are inputted to pixels of one row. This makes it possible to set the length of a sustain (lights-on) period without restriction, even to a shorter length than an address (writing) period in pixels of the respective rows, thereby providing multi-gray scale.

Secondly, in the driving method of the present invention, the EL element is brought into non-display state by changing the electric potential of the storage capacitor line. A constant electric potential is thus given to a cathode wiring. Since it is not a pulsated signal as in prior art, various problems caused by dulled voltage waveform of the cathode wiring can be avoided.

Lastly, there is no need to newly add a transistor, a capacitor, or a wiring to the components of the pixel portion. Therefore the quality of displayed image can be improved without lowering the aperture ratio.

What is claimed is:

1. An electronic device comprising:
   a first pixel comprising:
      a first transistor comprising a first gate, a first source, and a first drain;
      a first capacitor comprising a first electrode and a second electrode;
      a second transistor comprising a second gate, a second source, and a second drain; and
      a first EL element electrically connected to one of the second source and the second drain,
   wherein the first gate is electrically connected to a first line,
   wherein one of the first source and the first drain is electrically connected to a second line,
   wherein the second gate is electrically connected to the first electrode,
   wherein the other of the second source and the second drain is electrically connected to a fourth line,
   wherein the second electrode is electrically connected to a third line,
   wherein the first line intersects with the second line, wherein the first line intersects with the fourth line,
wherein each of the first transistor and the second transistor is p-channel type,
wherein an electric potential of the first line is higher than an electric potential of the third line when the first transistor is in an off state,
wherein an electric potential of the first line is lower than an electric potential of the second line when the first transistor is in an on state,
wherein the electric potential of the second line when the first transistor is in an on state is lower than the electric potential of the first line when the first transistor is in an off state,
wherein the electric potential of the third line is lower than or equal to an electric potential of the second line when the first transistor is in an off state,
wherein the third line has a first potential in a first period and a second potential in a second period during the first transistor is an off state,
wherein the second potential is higher than the first potential, and
wherein, in the second period, an electric potential of the second gate is higher than the electric potential of the first line.

2. An electronic device according to claim 1, wherein the other of the first source and the second drain is electrically connected to the first capacitor.

3. An electronic device according to claim 1, wherein said electronic device is a device selected from the group consisting of: an EL display, a video camera, a head-mount display, a DVD player, a personal computer, a cellular phone and an audio system for automobiles.

4. An electronic device according to claim 1, wherein the first line is parallel to the third line.

5. An electronic device according to claim 1, further comprising:
a second pixel adjacent to the first pixel, comprising:
a third transistor comprising a third gate, a third source, and a third drain;
a second capacitor comprising a third electrode and a fourth electrode;
a fourth transistor comprising a fourth gate, a fourth source, and a fourth drain; and
a second EL element electrically connected to one of the fourth source and the fourth drain; and
a third pixel adjacent to the second pixel, comprising:
a fifth transistor comprising a fifth gate, a fifth source, and a fifth drain;
a third capacitor comprising a fifth electrode and a sixth electrode;
a sixth transistor comprising a sixth gate, a sixth source, and a sixth drain; and
a third EL element electrically connected to one of the sixth source and the sixth drain,
wherein the third gate is electrically connected to the first line,
wherein one of the third source and the third drain is electrically connected to a fifth line,
wherein the fourth gate is electrically connected to the third electrode,
wherein the other of the fourth source and the fourth drain is electrically connected to a sixth line,
wherein the fourth electrode is electrically connected to the third line,
wherein the fifth gate is electrically connected to the first line,
wherein one of the fifth source and the fifth drain is electrically connected to a seventh line,
wherein the sixth gate is electrically connected to the fifth electrode,
wherein the other of the sixth source and the sixth drain is electrically connected to an eighth line,
wherein the sixth electrode is electrically connected to the third line,
wherein the fourth line, the sixth line, and the eighth line are distinct from one another,
wherein the third line intersects with the second line, and
wherein the third line intersects with the fourth line.

6. An electronic device according to claim 5, wherein each of the third transistor and the fifth transistor is p-channel type.

7. An electronic device comprising:
a first pixel comprising:
a first transistor comprising a first gate, a first source, and a first drain;
a first capacitor comprising a first electrode and a second electrode;
a second transistor comprising a second gate, a second source, and a second drain; and
a first EL element electrically connected to one of the second source and the second drain,
a first driver circuit electrically connected to a first line; and
a second driver circuit electrically connected to a second line,
wherein the first gate is electrically connected to the first line,
wherein one of the first source and the first drain is electrically connected to the second line,
wherein the second gate is electrically connected to the first electrode,
wherein the other of the second source and the second drain is electrically connected to a fourth line,
wherein the second electrode is electrically connected to a third line,
wherein the first line intersects with the second line,
wherein the first line intersects with the fourth line,
wherein each of the first transistor and the second transistor is p-channel type,
wherein an electric potential of the first line is higher than an electric potential of the third line when the first transistor is in an off state,
wherein an electric potential of the first line is lower than an electric potential of the second line when the first transistor is in an on state,
wherein the electric potential of the second line when the first transistor is in an on state is lower than the electric potential of the first line when the first transistor is in an off state,
wherein the electric potential of the third line is lower than or equal to an electric potential of the second line when the first transistor is in an off state,
wherein the third line has a first potential in a first period and a second potential in a second period during the first transistor is an off state,
wherein the second potential is higher than the first potential, and
wherein, in the second period, an electric potential of the second gate is higher than the electric potential of the first line.

8. An electronic device according to claim 7, wherein the first pixel and the second driver circuit are provided over a same substrate.

9. An electronic device according to claim 7, wherein the other of the first source and the second drain is electrically connected to the first capacitor.

10. An electronic device according to claim 7, wherein said electronic device is a device selected from the group consisting of: an EL display, a video camera, a head-mount display, a DVD player, a personal computer, a cellular phone and an audio system for automobiles.

11. An electronic device according to claim 7, wherein the first line is parallel to the third line.

12. An electronic device according to claim 7, further comprising:
   a second pixel adjacent to the first pixel, comprising:
      a third transistor comprising a third gate, a third source, and a third drain;
      a second capacitor comprising a third electrode and a fourth electrode;
      a fourth transistor comprising a fourth gate, a fourth source, and a fourth drain; and
      a second EL element electrically connected to one of the fourth source and the fourth drain; and
   a third pixel adjacent to the second pixel, comprising:
      a fifth transistor comprising a fifth gate, a fifth source, and a fifth drain;
      a third capacitor comprising a fifth electrode and a sixth electrode;
      a sixth transistor comprising a sixth gate, a sixth source, and a sixth drain; and
      a third EL element electrically connected to one of the sixth source and the sixth drain,
   wherein the third gate is electrically connected to the first line,
   wherein one of the third source and the third drain is electrically connected to a fifth line,
   wherein the fourth gate is electrically connected to the third electrode,
   wherein the other of the fourth source and the fourth drain is electrically connected to a sixth line,
   wherein the fourth electrode is electrically connected to the third line,
   wherein the fifth gate is electrically connected to the first line,
   wherein one of the fifth source and the fifth drain is electrically connected to a seventh line,
   wherein the sixth gate is electrically connected to the fifth electrode,
   wherein the other of the sixth source and the sixth drain is electrically connected to an eighth line,
   wherein the sixth electrode is electrically connected to the third line,
   wherein the fourth line, the sixth line, and the eighth line are distinct from one another,
   wherein the third line intersects with the second line, and
   wherein the third line intersects with the fourth line.

13. An electronic device according to claim 12, wherein each of the third transistor and the fifth transistor is p-channel type.

14. An electronic device according to claim 12, wherein the second pixel, the third pixel, and the second driver circuit are provided over a same substrate.

* * * * *